(12) United States Patent
Perona et al.

(10) Patent No.: US 11,584,313 B2
(45) Date of Patent: Feb. 21, 2023

(54) CONTROL SYSTEM FOR VEHICLE INTERIOR

(71) Applicant: Tangi0 Limited, London (GB)

(72) Inventors: Francesca Perona, London (GB); Ming Kong, London (GB); Jose Rodriguez Javaloyes, London (GB); Chia-hung Lin, London (GB); Ilan Olivarez Correa, London (GB); Hamidreza Nikkhou Sarighieh, London (GB)

(73) Assignee: TANGI0 LIMITED, London (GB)

( * ) Notice: Subject to any disclaimer, the term of this patent is extended or adjusted under 35 U.S.C. 154(b) by 226 days.

(21) Appl. No.: 16/947,904

(22) Filed: Aug. 24, 2020

(65) Prior Publication Data
US 2021/0053512 A1 Feb. 25, 2021

(30) Foreign Application Priority Data
Aug. 23, 2019 (GB) ...................... 1912174

(51) Int. Cl.
*B60R 16/02* (2006.01)
*F21V 8/00* (2006.01)
*G06F 3/041* (2006.01)
*G06F 3/044* (2006.01)

(52) U.S. Cl.
CPC ............ *B60R 16/02* (2013.01); *G02B 6/0001* (2013.01); *G06F 3/044* (2013.01); *G06F 3/0416* (2013.01)

(58) Field of Classification Search
None
See application file for complete search history.

(56) References Cited

U.S. PATENT DOCUMENTS

| 5,917,165 A | 6/1999 | Platt et al. |
| 6,373,265 B1 | 4/2002 | Morimoto et al. |
| 8,859,922 B1 | 10/2014 | Sage et al. |
| 2005/0248544 A1 | 11/2005 | Adam et al. |

(Continued)

FOREIGN PATENT DOCUMENTS

| DE | 102017006469 B3 | 11/2018 |
| EP | 2355356 A1 | 8/2011 |

(Continued)

OTHER PUBLICATIONS

Search Report, GB Application No. GB1912174.8, dated Feb. 5, 2020, 4 pages.

(Continued)

*Primary Examiner* — Stephen T. Reed
(74) *Attorney, Agent, or Firm* — Husch Blackwell LLP

(57) ABSTRACT

A control system for a vehicle interior comprising a control element for a user to interact with is provided. The control element may comprise a sensing electrode configured to provide one or more electrical signals and a non-conductive cover material provided on or over the sensing electrode. The sensing electrode may be formed of or comprise a conductive plastic. The non-conductive cover material may be formed of or comprise a non-conductive plastic. The non-conductive cover material may be or comprise an outer layer, over-layer or skin of the control element. The non-conductive cover material may provide one or more touch interactive surfaces of the control element.

21 Claims, 14 Drawing Sheets

(56) References Cited

U.S. PATENT DOCUMENTS

| | | |
|---|---|---|
| 2009/0009491 A1 | 1/2009 | Grivna |
| 2014/0340353 A1 | 11/2014 | Chen et al. |
| 2018/0056788 A1 | 3/2018 | Boron et al. |
| 2019/0391672 A1* | 12/2019 | Fischer ................ G06F 3/0362 |
| 2021/0055806 A1* | 2/2021 | Shepelev ............... B60K 37/06 |

FOREIGN PATENT DOCUMENTS

| | | |
|---|---|---|
| EP | 2660981 A2 | 11/2013 |
| EP | 3567462 A1 | 11/2019 |
| EP | 3640771 A2 | 4/2020 |
| GB | 2573752 A | 11/2019 |
| WO | 2016206819 A1 | 12/2016 |

OTHER PUBLICATIONS

Extended European Search Report, European Application No. 20192367.9, dated Apr. 14, 2021, 15 pages.

* cited by examiner

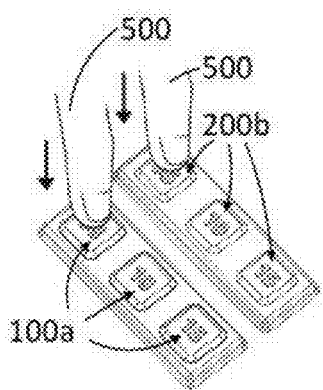
Figure 3a
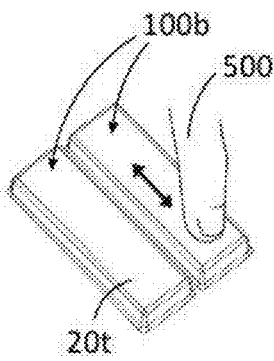
Figure 3b
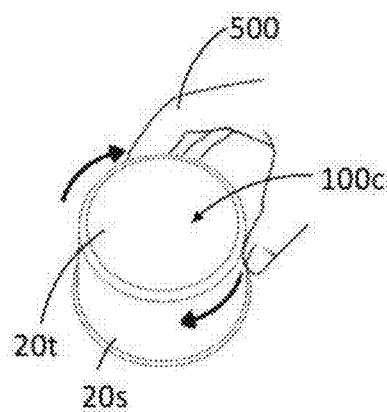
Figure 3c
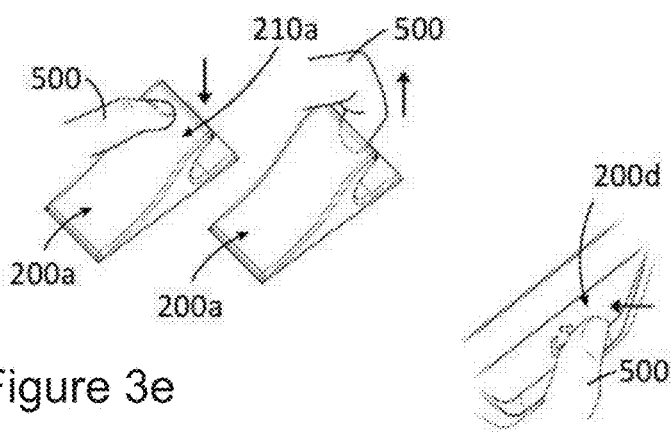
Figure 3e
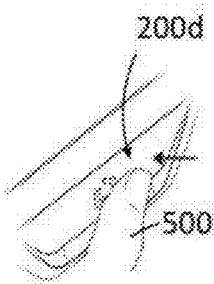
Figure 3g
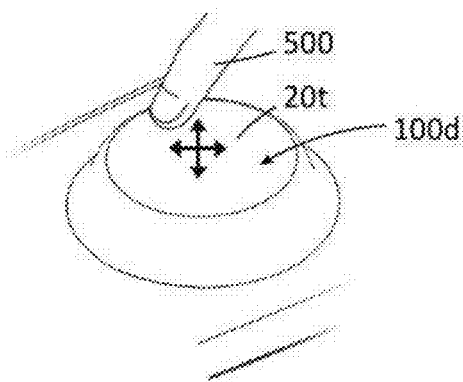
Figure 3h
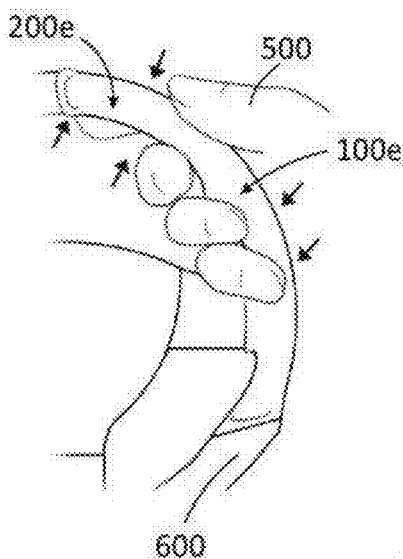
Figure 3i
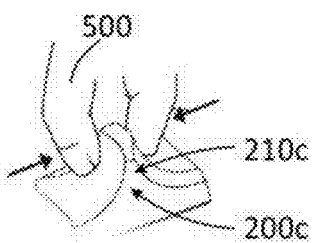
Figure 3f
Figure 3d

CONTROL SYSTEM FOR VEHICLE INTERIOR

CROSS REFERENCE TO RELATED APPLICATIONS

This application claims priority to GB Patent Application No. 1912174.8, filed on Aug. 23, 2019, which is incorporated herein by reference in its entirety.

TECHNICAL FIELD

This invention relates generally to a control system for the interior of a vehicle, such as an automobile, having one or more plastic-based touch and/or pressure/force sensing control elements that a user can interact with for controlling one or more functions of the vehicle.

BACKGROUND TO THE INVENTION

The interior of vehicles such as automobiles and aircraft comprise a host of user interface controls (control elements) that allow the user (the driver or passenger) to control various functions of the vehicle. For example, in automobiles, such functions include, but are not limited to, operating the windows, climate control system, navigation system, entertainment system, locking/unlocking the doors, adjusting the seats, etc. Traditionally, user interface controls have been in the form of electromechanical push buttons, switches and rotary knobs, composed of a number of injection-moulded plastic sub-parts that are fitted together to mechanically move and actuate electronic components mounted to an underlying circuit board. The main issue with these traditional technologies is the large number of sub-parts needed for the assembly of relatively simple functional elements, and the standardised actuating mechanisms that rely on particular electronic components and mounting configurations. This places a limit on the complexity of the control system and the design freedom of the vehicle interior. For example, the position or arrangement of such traditional control elements may be dictated more by mechanical/physical constraints associated with the size, shape and/or rigidity of the materials and/or components used, rather than ergonomic considerations. Such multi-part control interfaces are also prone to collecting dust and allow ingress of water through the grooves and slots that separate the parts, which can lead to failure of the devices.

The growing number of increasingly complex devices and functions available in vehicles today has created a demand for new control concepts that make use of different technologies and materials with an increasing emphasis on simplicity, reliability and ergonomic design. In particular, as the automotive sector moves towards integrating control interfaces seamlessly in interior surfaces following current technology trends, there is a growing need for seamless and adaptable control interface solutions, in which styling, ergonomic design and functionality are flexible. With the increasing amount of technology crammed into vehicles which can be seen as a distraction, there is also a safety drive for automotive control interfaces to allow users to intuitively operate them without needing to take their eyes off the road. For this reason, (3D) profiled control interfaces that can be easily manipulated by the user, such as raised tactile buttons, rotary knobs and push-pull buttons currently populate the automotive interior space.

Capacitive touch sensitive control elements and panels are currently replacing traditional electromechanical control elements, as these are typically re-configurable and can provide the function of buttons, switches and/or trackpads. However, although a relatively mature technology, traditional capacitive sensors require sophisticated fabrication techniques and expensive materials, which increases the overall cost of vehicle interiors. In addition, this sensing technology is often incompatible with three-dimensionally (3D) profiled surfaces, and as such, capacitive touch interfaces are typically integrated into flat surfaces of vehicle interior which limits the range of gestural interactions that a user can make and limits the ergonomic design considerations that can enhance driver safety.

There is therefore a need for a control system for a vehicle interior that makes use of ergonomic control elements/interfaces that can be seamlessly integrated anywhere in the vehicle's interior, are simple and cheap to manufacture, without sacrificing functionality.

Aspects and embodiments of the present invention have been devised with the foregoing in mind.

SUMMARY OF THE INVENTION

According to a first aspect of the invention, there is provided a control system for a vehicle interior comprising a control element for a user to interact with. The control element may comprise a sensing electrode configured to provide one or more electrical signals and a non-conductive cover material provided on or over the sensing electrode. The sensing electrode may be formed of or comprise a conductive plastic. The non-conductive cover material may be formed of or comprise a non-conductive plastic. The non-conductive cover material may be or comprise an outer layer, over-layer or skin of the control element. The non-conductive cover material may provide one or more touch interactive surfaces of the control element. The sensing electrode may be configured to be connectable and/or electrically connectable to a connection circuit board by means of mechanical and/or frictional engagement for measuring the one or more electrical signals. The mechanical and/or frictional engagement may be a mechanical contact or a mechanical electrical connection. The one or more electrical signals may be provided in response to a change in capacitance (e.g. of the sensing electrode) caused by contact and/or movement of a conductive object on/over the non-conductive material provided on/over the sensing electrode. Additionally or alternatively, the change in capacitance may be caused by a pressure or force applied on or to the non-conductive material. The control system may be connectable to an electronic control unit (ECU) of the vehicle for controlling one or more user controllable vehicle functions in response to the user interaction with the control element.

In this context, the term "mechanical contact" means physically in contact therewith to provide an electrical connection therebetween that is non-permanent, i.e. not a solder joint or other form of wire bonding.

The control element is a plastic-based capacitive touch and/or mechanical deformation/pressure sensor for automotive applications. The system provides a solution for ergonomic and three dimensionally (3D) profiled touch and/or pressure sensitive user interfaces for automotive applications that can be easily manufactured and assembled at low cost. The use of conductive plastics for the sensing electrode has a number of advantages over conventional touch and/or electromechanical pressure sensing technologies that use metal electrodes. Firstly, the material cost and weight is significantly lower than that of conventional metal electrode materials (such as a gold, silver or aluminium). Secondly, as plastics are mouldable the sensing electrode and the non-conductive material may be formed and/or moulded into almost any arbitrary size, shape or 3D form due to the nature of the moulding process, allowing the plastic-based control elements to be seamlessly integrated into interior surfaces of a vehicle. Further, the shape/size of the plastic parts may be specifically chosen or designed to provide different user interactive functions, such as touch buttons, touch sliders, touch trackpads and static rotary knobs, and push-pull switches/triggers, toggle switches, push buttons, and twist handles.

The control element can be actuated by touching the control element (i.e. cover material over the sensing electrode) with a conductive object, such as a finger, and/or by applying pressure or force (e.g. a push and/or a pull) on or to the control element to move and/or deform the sensing electrode relative to the connection circuit board so as to change the distance between at least a portion of the sensing electrode and a sensing point on the connection circuit board. Touching control element may change the self-capacitance of the sensing electrode measured at a sensing point on the connection circuit board, while moving/deforming the sensing electrode may change the capacitance between the sensing electrode and a sensing point, both of which result in a change in the measured electrical signal at the sensing point. In the latter case, the control element may comprise a movable and/or deformable conductive plastic component that interacts directly with the underlying connection circuit board to provide the functionality of traditional electromechanical car interior switches but with minimal parts.

Because the conductive plastic sensing electrode can be electrically connected to the connection circuit board by means of mechanical and/or frictional engagement, the plastic sensing electrode can be mounted and connected to the connection circuit board without the use of hard wiring or soldering, which greatly simplifies and reduces the cost of manufacture and assembly of the control element. The plastic sensing electrode can be a unitary movable or deformable part that interacts directly with the underlying connection circuit board, reducing the number of parts of the control element. Further, because the conductive plastic sensing electrode can be secured to the connection circuit board by means of mechanical and/or frictional engagement, the assembly of the control system is greatly simplified and the assembly time of the system is greatly reduced, further lowering the associated manufacture/assembly cost compared to conventional metal-based sensor technologies. To assemble the system, the sensing electrode may be simply pushed, slide and/or clipped into place on the connection circuit board to effect the mechanical electrical connection, and the frictional engagement with the connection circuit board secures and retains the sensing electrode in place, and maintains the mechanical electrical connection, for the remaining assembly steps and during use of the system once installed into a vehicle.

Further practical and functional advantages of the use of conductive plastic electrodes for a capacitive touch sensor include:

The sensing electrode can be formed/moulded to conform to the exterior shape of the vehicle component regardless of the complexity of the exterior shape. This eliminates the need for flexible printed circuits which introduce complexity in the electrode arrangement, wiring, increased potential for wear and tear as well as increased assembly costs.

The sensing electrode can cover larger areas enabling it to be much more sensitive to capacitance changes and thus produce larger signal changes for a given user interaction (e.g. touch or push/pull) compared to the typically smaller metal electrode counterparts.

The size and shape of the sensing electrode can be chosen to tailor the electrical signals produced, e.g. to produce smooth electrical signal changes between a minimum and maximum signal values. This allows the sensing electrode to sense a wider range of user interactions, including customised detection of different finger movement interactions.

Overall, the design freedom for the control element, the electrode arrangement and the touch sensing control element itself are significantly increased.

The sensing electrode and the cover material may be formed by an injection moulding process. Optionally or preferably, the cover material is substantially flexible/deformable and resilient. The system may comprise a connection circuit board comprising one or more sensing points for measuring the one or more electrical signals. The connection circuit board may be configured to electrically connect to the sensing electrode at least one of the one or more sensing points by means of mechanical and/or frictional engagement. The sensing electrode may be configured to mechanically contact at least one of the one or more sensing points on the connection circuit board to provide an electrical connection therebetween.

The sensing electrode may comprise a first portion configured to face and mechanically contact and/or engage a first sensing point on the connection circuit board to provide an electrical connection therebetween. The first portion may be or comprise a projection. The mechanical contact or engagement between the first portion and the first sensing point may substantially prevent relative movement between the first portion and the first sensing point.

The first sensing point may be or comprise an electrical connector. The electrical connector may have a substantially rigid mating portion configured to mechanically contact, deform and/or penetrate the first portion of the sensing electrode to provide an electrical connection therebetween. This may electrically connect the sensing electrode to the connection circuit board at the first sensing point by mechanical engagement.

The electrical connector may further be configured to frictionally engage with the first portion of the sensing electrode to secure the sensing electrode to the connection circuit board. Alternatively or additionally, the connection circuit board may comprise a securing element configured to frictionally engage with a corresponding securing portion of the sensing electrode to secure the sensing electrode to the connection circuit board. The frictional engagement may maintain the mechanical contact (mechanical electrical connection) between the first portion and the first sensing point.

The electrical connector and/or securing element may be or comprise a projection that projects from the connection circuit board, and the first portion and/or securing portion of the sensing electrode may be or comprise a recess configured to frictionally engage with the projection. Alternatively, the electrical connector and/or securing element may be or comprise a recess, opening or through-hole in the connection circuit board, and the first portion and/or the securing portion of the sensing electrode may be or comprise a projection configured to frictionally engage with the recess, opening or through-hole.

The control element may comprise a plurality of said conductive plastic sensing electrodes and the non-conductive plastic cover material may be provided on or over each sensing electrode. Each sensing electrode may be configured to provide a characteristic or predefined change in the one or more electrical signals in response to movement of a conductive object on/across the non-conductive plastic material. Two or more adjacent sensing electrodes may be configured to interdigitate with each other in one or more directions, so as to provide a substantially smooth change in the one or more electrical signals in response to movement of said conductive object on/across the non-conductive plastic material over the adjacent sensing electrodes.

The mechanical contact or engagement between the first portion and the first sensing point may permit movement of the first portion relative to the first sensing point whilst maintaining constant electrical contact with the first sensing point. The first portion may be configured to permit the sensing electrode to pivot/rotate about/around the first portion, whilst maintaining constant electrical contact with the first sensing point.

The sensing electrode may comprise a second portion configured to face a second sensing point on the connection circuit board. The second sensing point may be on the same side or the opposite side of the connection circuit board as/to the first sensing point. The second portion may be movable and/or deformable in response to a pressure/force applied to the sensing electrode from a rest position to first actuated position so as to change a distance between the second portion and the second sensing point. The sensing electrode may be configured to pivot/rotate about/around the first portion from the rest position to the first actuated position. Optionally, the second portion may be configured to move, or at least partially deform/bend, with respect to the first portion in response to a pressure or force applied to the second portion.

The sensing electrode may comprise a slot for receiving a portion of the connection circuit board. The sensing electrode may be configured to grip and/or frictionally engage the connection circuit board between opposing walls of the slot. The gripping action and/or frictional engagement may maintain the mechanical contact (mechanical electrical connection) between the first portion and the first sensing point.

The sensing electrode may comprise a third portion configured to face a third electrode on the connection circuit board. The third sensing point may be located on the same side or the opposite side of the connection circuit board as/to the second sensing point. The third portion may be movable and/or deformable in response to a pressure/force applied to the sensing electrode from a rest position to a second actuated position so as to change a distance between the third portion and the third sensing point. The sensing electrode may be configured to pivot/rotate about/around the first portion from the rest position to the second actuated position. Optionally, the third portion may be configured to move, or at least partially deform/bend, with respect to the first portion in response to a pressure/force applied to the third portion.

The one or more electrical signals may be provided in response to a change in capacitance between the sensing electrode and one or more sensing points on the connection circuit board (e.g. the second and/or third sensing point) caused by a force or pressure applied to the sensing electrode that changes a distance between one or more portions of the sensing electrode (e.g. the second and/or third portion) and a respective sensing point on the connection board. Each sensing point may be associated with a different portion of the sensing electrode.

The first, second and third portions of the sensing electrode may be part of a unitary piece of conductive plastic. Alternatively, the first, second and third portions of the sensing electrode may be or comprise separate pieces of conductive plastic.

According to a second aspect of the invention, there is provided a control system for a vehicle interior comprising a control element for a user to interact with. The control element may comprise a sensing electrode configured to provide one or more electrical signals and a non-conductive material provided on or over the sensing electrode. The sensing electrode may be formed of or comprise a conductive plastic. The non-conductive material may be formed of or comprise a non-conductive plastic. The one or more electrical signals may be provided in response to a change in capacitance of the sensing electrode caused by a conductive object, such as a user's finger or thumb, being in proximity to or in contact with the non-conductive material. The non-conductive material may be or comprise an outer layer, over-layer or skin of the control element. The non-conductive material may provide one or more touch interactive surfaces of the control element. The capacitance may be a self-capacitance of the sensing electrode. The sensing electrode may be configured to be connectable by means of frictional engagement to a connection circuit board for measuring the one or more electrical signals at one or more sensing points. In this context, a sensing point defines a point of electrical connection between the sensing electrode and the connection circuit board. As such, the one or more sensing points may be considered to be on the sensing electrode or on the connection circuit board. The control system may be connectable to an electronic control unit (ECU) of the vehicle for controlling one or more user controllable vehicle functions in response to the user interaction with the control element. The control system may further comprise a connection circuit board for mounting the sensing electrode on or to. The connection circuit board may be configured to electrically connect to the sensing electrode at the one or more sensing points for measuring the one or more electrical signals. The connection circuit board may further be configured to secure the sensing electrode on or to the connection circuit board by means of frictional engagement, such as an interference fit.

The control element of the second aspect is a plastic-based capacitive touch sensor for automotive applications. The system provides a solution for ergonomic and three dimensionally (3D) profiled touch sensitive user interfaces for automotive applications that can be easily manufactured and assembled at low cost.

The sensing electrode may be electrically connected to the connection circuit board at the one or more sensing points associated with the sensing electrode. Where the sensing electrode is associated with more than one sensing point, each sensing point may be associated with a different portion of the sensing electrode. Each sensing point of the sensing electrode may be electrically connected to different conductive track on the connection circuit board. Where multiple sensing points are present, each sensing point associated with the sensing electrode may provide a separate electrical signal (to the measurement module) in response to the operator interacting with the control element. Each sensing point may provide a separate electrical signal in response to a conductive object, such as the operator's finger/thumb/hand, being on or near the surface of the non-conductive plastic material in proximity to the respective sensing point.

The connection circuit board may comprise one or more electrical connectors configured to mechanically contact the sensing electrode at the one or more sensing points. Advantageously, the mechanical connection means the sensing electrode can be directly electrically connected to the connection circuit board when the sensing electrode is fitted in place during assembly without the need for wires, soldering, conductive adhesives or other means of permanent electrical connection. The frictional engagement that secures the sensing electrode in place also maintains the mechanical electrical connection.

Each electrical connector may be or comprise a substantially rigid mating portion configured to mechanically contact, deform and/or penetrate a corresponding contacting portion of the sensing electrode (at a respective sensing point). The mating portion may be or comprise one or more metal projections, pins, a castellated pad, clip pins, and/or any other form of metal connector that allows a secure mechanical connection to the sensing electrode. The mating portion and the contacting portion may form a male-female connection. For example, the mating portion may be or comprise a projection that projects from the connection circuit board and the contacting portion may be or comprise an opening or recess configured to receive the projection of the mating portion, or vice versa, and make the electrical connection.

Optionally or preferably, the mating portion may be biased towards the contacting portion of the respective sensing electrode, or vice versa. For example, the mating portion may be spring loaded. Additionally or alternatively, the conductive plastic material of the sensing electrode may be substantially resilient and apply a reaction force bearing against the mating portion in response to deformation (compression or bending) by the mating portion.

The one or more electrical connectors may further be configured to provide the frictional engagement and/or interference fit between the sensing electrode and connection circuit board, i.e. the one or more electrical connectors may be configured to secure the sensing electrode on or to the connection circuit board by frictional engagement, in addition to making a mechanical electrical connection therebetween. Additionally or alternatively, the connection circuit board may comprise one or more separate connecting elements/portions configured to secure the sensing electrode on or to the connection circuit board by frictional engagement.

The or each electrical connector and/or connecting element may be or comprise a projection that projects from the connection circuit board, and the sensing electrode may comprise one or more recesses configured to frictionally engage with a respective projection. Where the electrical connectors are configured to secure the sensing electrode, at least one of the recesses may be or comprise the contacting portion of the sensing electrode. Alternatively, the or each electrical connector and/or connecting element may be or comprise a recess, opening or through-hole in the connection circuit board, and the sensing electrode may comprise one or more projections configured to frictionally engage with a respective recess, opening or through-hole.

The control element may comprise a plurality of conductive plastic sensing electrodes. Each sensing electrode may be positioned or arranged adjacent to each other. The non-conductive material may be provided on or over each sensing electrode. As such, the one or more touch sensitive surfaces may extend over a plurality of sensing electrodes. Each sensing electrode may be connected to the connection circuit board at one or more sensing points. Each sensing electrode may be configured to provide one or more electrical signals in response to a change in capacitance of the respective sensing electrode caused by a conductive object being in proximity to or in contact with the non-conductive material on or over the respective sensing electrode.

Where the plurality of sensing electrodes are adjacent each other, at least two adjacent sensing electrodes may be shaped and/or configured to interdigitate and/or interlock with each other in one or more directions. In this way, movement of a conductive object on/across the non-conductive plastic material on or over the at least two sensing electrodes may provide a characteristic signal profile change in the one or more electrical signals, that may be a substantially smooth change. The at least two adjacent sensing electrodes may provide a first touch interactive surface.

The control element may be configured to provide a change in the one or more electrical signals in response to contact and/or movement of a conductive object on/across the non-conductive plastic material relative to the one or more sensing points of the or each sensing electrode. The change in the one or more electrical signals may result from a change in an overlap area between the conductive object and a sensing electrode and/or a change in distance between the conductive object and a sensing point of a sensing electrode. Optionally or preferably, the sensing electrode may be shaped to provide the one or more electrical signals in response to linear and/or circular movements of a conductive object across the non-conductive plastic material.

The control element may be configured to detect one or more of: a contact/touch from a user, contact/touch position, speed and/or direction of movement of said conductive object on/across the surface of the non-conductive plastic material relative to the one or more sensing points based on the one or more electrical signals. The control element may be shaped and configured to provide a touch button function, slider function, trackpad function, and/or a static rotary knob function.

Where the change in electrical signal results from the change in distance between a conductive object and a sensing point, the change may be related to a change in capacitance registered by the sensing point in response to the position/location of the conductive object on the surface. The or each sensing electrode may have an electrical resistivity in the range of substantially $1\times10^2$ to $1\times10^6$ Ohm·cm. Having a large resistivity means that the magnitude of the measured capacitance varies more strongly with the distance between the location of the conductive object and an individual sensing point. The resistivity and/or resistance of the or each sensing electrode may be tuned via the intrinsic material properties of the conductive plastic (i.e. intrinsic resistivity). Alternatively or additionally, the resistivity and/or resistance of the sensing electrode may be tuned without changing the intrinsic material properties by introducing instead one or more holes, hollows, recesses, thickness variations, and/or repeating geometric patterns/tracks into sensing electrode. For example, the sensing electrode may be or comprise a complex shape and/or a repeating geometric pattern to provide a predetermined resistance between any two given points. There may be a plurality of hollows and/or recesses forming a regular array. The one or more holes, hollows and/or recesses may define a non-linear conduction path between the two points. Alternatively or additionally, the one or more hollows and/or recesses may define a plurality of linear and/or non-linear conduction paths between the two points.

Where the control element comprises a plurality of sensing electrodes, the plurality of adjacent sensing electrodes may be shaped and/or configured to fit together, interdigitate and/or interlock to form a 3D structure. The non-conductive material may be provided over or cover the 3D structure to provide one or more touch interactive surfaces. The or each touch interactive surface may extend across or over a plurality of sensing electrodes. Each sensing electrode may comprise one or more sensing points. The control element may comprise a first and second touch sensitive surface. Touch and/or movement of a conductive object on/across the non-conductive plastic material on or over the first and second touch interactive surfaces may provide a different/distinguishable change in the one or more electrical signals.

A touch button control element may comprise a first touch interactive surface. The touch button control may be configured to detect when a conductive object is in contact or close proximity with the first touch interactive surface of the non-conductive material over the or each sensing electrode. Where a plurality of sensing electrodes are present, each sensing electrode may define a sub-region of first touch interactive surface, such that a contact or touch in/on each different sub-region may be detected. In this way, the control element may provide a multi-button and/or key pad function.

A slider control element may comprise a first touch interactive surface. The slider control element may be configured to detect when a conductive object is in contact or close proximity with the first touch interactive surface of the non-conductive material over the or each sensing electrode. In addition, the slide control element may be configured to detect the position, the direction and/or the amount of movement of the conductive object on/across the first touch interactive surface along a single path (which may be a linear or curved path) based on the change of distance between the conductive object and a sensing point.

A trackpad control element may comprise a first touch interactive surface. The trackpad pad may comprise a plurality of interlocking sensing electrodes. The trackpad control element may be configured to detect when a conductive object is in contact or close proximity with the touch interactive surface of the non-conductive material over the or each sensing electrode. In addition, the trackpad control element may be configured to detect the position, and/or detect direction and/or amount of movement of the conductive object on/across the touch interactive surface along multiple paths (which may be linear or curved paths) based on the change of distance between the conductive object and a sensing point and/or the change in overlap between the conductive object and the or each sensing electrode.

A static rotary knob control element may have a raised 3D structure with a top surface and a side surface. The raised 3D structure may have a top and a side. The static rotary knob control element may comprise a first touch interactive surface. The first touch interactive surface may be or comprise at least part of the side surface, and/or may extend at least partially around a side of the 3D structure. The side surface may be substantially curved and configured to provide a slider function, e.g. a first touch interactive surface that can detect when a conductive object is in contact or close proximity with the side surface of the non-conductive material over the or each sensing electrode, and in addition detect the position, and/or the direction and/or amount of movement of the conductive object around the side surface along a single path based on the change of distance between the conductive object and a sensing point and/or the change in overlap between the conductive object and the or each sensing electrode. In this way, the static rotary knob can replicate the function of a mechanical rotary knob without the control element rotating. Optionally, the static rotary knob control element may comprises a second touch interactive surface, The second touch interactive surface may be or comprise at least part of the top surface. The top surface may be substantially flat or curved. The second touch interactive surface may be configured to provide a touch button and/or a trackpad function, as described above.

According to a third aspect of the invention, there is provided a control system for a vehicle interior comprising a control element for a user to interact with. The control element may comprise a sensing electrode configured to provide one or more electrical signals and a non-conductive material provided on or over the sensing electrode. The sensing electrode may be formed of or comprise a conductive plastic. The non-conductive material may be formed of or comprise a non-conductive plastic. The non-conductive material may be or comprise an outer layer, over-layer or skin of the control element. The sensing electrode or control element may be configured to be connectable to a connection circuit board comprising one or more sensing points for measuring the one or more electrical signals. The one or more electrical signals may be provided in response to a change in capacitance between the sensing electrode and at least one of the one or more sensing points of the connection circuit board resulting from a pressure or force applied to the sensing electrode that changes a distance between the sensing electrode and the at least one of the one or more sensing points on the connection circuit board. The control system may be connectable to an electronic control unit (ECU) of the vehicle for controlling one or more user controllable vehicle functions in response to the user interaction with the control element. The control system may comprise a connection circuit board for mounting the sensing electrode on or to. The connection board may comprise one or more sensing points for measuring the one or more electrical signals.

The control element of the third aspect is a plastic-based mechanical deformation or pressure sensor for automotive applications. The system provides a solution for ergonomic and three dimensionally (3D) profiled pressure sensitive user interfaces for automotive applications that can be easily manufactured and assembled at low cost, as described with reference to the first aspect.

The or each sensing point on the connection circuit board may be or comprise an electrode. The or each electrode may be or comprise a metal or metal alloy pad, or a conductive plastic or polymer pad. Each electrode on the connection circuit board may face a different portion of the sensing electrode. Each portion of the sensing electrode may interact capacitively with a respective electrode on the connection circuit board, or vice versa.

The one or more sensing points may comprise a first electrode or first sensing point that faces a first portion of the sensing electrode. The first electrode/sensing point may be on a first side of the connection circuit board. The sensing electrode may comprise a first portion configured to contact the connection circuit board. The first portion of the sensing electrode may contact the first electrode/sensing point of the connection circuit board. Optionally or preferably, the first electrode/sensing point of the connection circuit board may be a ground or reference point.

The capacitance measured at the second electrode/sensing point may be altered by a variable interaction with the first electrode/sensing point via the second portion which is electrically connected to the first electrode/sensing point. The first portion may be configured to separate the second portion from the second electrode/sensing point on the connection board by the first distance in the rest position. The second portion may be or comprise one or more projections extending towards the connection circuit board.

The one or more sensing points may comprise a second electrode/sensing point that faces a second portion of the sensing electrode. The second electrode/sensing point may be on a first side of the connection circuit board. The sensing electrode may be movable and/or deformable in response to a pressure or force applied to the sensing electrode from a rest position, in which the second portion of the sensing electrode is positioned at a first distance from the second electrode/sensing point of the connection circuit board, to a first actuated position, in which the second portion of the sensing electrode is positioned at a second distance from the second electrode/sensing point of the connection circuit board. The second distance is different to the first distance.

The second portion may be separated from the second electrode/sensing point by the first distance in the rest position. The sensing electrode may be configured such the second portion moves and/or deforms towards or away from the second electrode/sensing point in response to an applied pressure or force. The second distance may be less than the first distance and equal to or greater than zero. As such, the force or pressure may move or deform the second portion into contact with the second electrode/sensing point.

The sensing electrode may be configured to move between the rest and first actuated position by pivoting and/or deforming in response to the applied pressure or force.

The second portion may be configured to deform with respect to the first portion towards the second electrode/sensing point or first actuated position in response to a pressure or force applied to the second portion. In this way, movement between the rest and first actuated position may result from deformation of the second portion.

The sensing electrode may be configured to pivot/rotate about/around the first portion between the rest position and the first actuated position in response to a pressure or force applied to the sensing electrode. Optionally or preferably, the second portion may be configured to at least partially deform/bend/move with respect to the first portion in response to a pressure or force applied to the first portion, e.g. towards the first actuated position. In this way, movement between the rest and first actuated position may result from a pivoting and optionally partial deformation.

The sensing electrode may comprise a third portion. The one or more sensing points may comprise a third electrode/sensing point that faces the third portion. The sensing electrode may be movable and/or deformable in response to a pressure or force applied to the sensing electrode from the rest position, in which the third portion of the sensing electrode is positioned at a third distance from the third electrode/sensing point of the connection circuit board, to a second actuated position, in which the third portion of the sensing electrode is positioned at a fourth distance from the third electrode/sensing point of the connection circuit board. The fourth distance may be different to the third distance.

The third portion may be separated from the third electrode/sensing point by the third distance in the rest position. The sensing electrode may be configured such the third portion moves and/or deforms towards or away from the third electrode/sensing point in response to an applied pressure or force. The fourth distance may be less than the third distance and equal to or greater than zero. As such, the force or pressure may move or deform the third portion into contact with the third electrode. The first portion may be configured to separate the third portion from the third electrode/sensing point by the third distance in the rest position.

The sensing electrode may be configured to move between the rest and second actuated position by pivoting and/or deforming in response to the applied pressure or force. The sensing electrode may be configured to pivot/rotate about/around the first portion between the rest position and the second actuated position. Optionally or preferably, the third portion may be configured to at least partially deform/bend/move with respect to the first portion in response to a pressure or force applied to the third portion, e.g. towards the second actuated position. In this way, movement between the rest and second actuated position may result from a pivoting and optionally partial deformation.

The control element may comprise a handle portion for the user to handle, grip and/or manipulate so as to apply the force/pressure to move/deform the sensing electrode. The handle portion may be or comprise a projection or extension for the user to grip, push, pull and/or lift to move and/or deform the sensing electrode. The handle portion may extend away from the sensing electrode and/or the connection circuit board. The sensing electrode may comprise a force transferring portion that extends into the handle portion. The force transferring portion may transfer the force or pressure to the first and/or third portion of the sensing electrode. For example, the force transferring portion may be or comprise a projection or extension that provides a lever action, e.g. to make the sensing electrode pivot and/or deform about/around the second portion in response to a force or pressure applied to the extension.

The sensing electrode may be configured to pivot or rotate about the first portion in a single plane or in multiple different planes. The or each pivot plane may be substantially normal or perpendicular to the plane of the connection circuit board. The sensing electrode may be configured to pivot/rotate between the rest position and the first actuated position in a first plane substantially normal to a plane of the connection board, and pivot/rotate between the rest position and the second actuated position in substantially the same plane as the first plane. Alternatively, the sensing electrode may be configured to pivot/rotate between the rest position and the second actuated position in a second plane substantially normal to the plane of the connection board, the second plane being different to the first plane. For example, the second plane may be at an azimuthal angle to the first plane (with respect to the axis normal to the connection circuit board) between 0 and 180 degrees.

The third electrode/sensing point may be on the same side of the connection circuit board as the second electrode/sensing point (the first side). In this case the second and third portions may be arranged on the same side of the connection circuit board. In addition, where the sensing electrode pivots between the rest and first/second actuated positions in the same plane, the second and third portions may be arranged either side of the first portion. For example, the second and third portions may be arranged on opposite sides of, and/or symmetrically about the position of, the first portion.

Alternatively, the third electrode/sensing point may be on the opposite side (a second side) of the connection circuit board to the first and/or second electrode/sensing point. In this case, the second and third portions may be arranged on either side of the connection circuit board. In addition, where the sensing electrode pivots between the rest and first/second actuated positions in the same plane, the second and third portions may be arranged on the same side of the first portion.

The sensing electrode may comprise a fourth portion or extruded portion configured to contact the connection circuit board at an opposite side (the second side) of the connection circuit board to the first portion. In this way, the sensing electrode may be configured to grip and/or frictionally engage the connection circuit board between the first portion and the fourth portion. For example, the sensing electrode may comprise a slot for receiving a portion of the connection circuit board, and the first and fourth portions may be located on opposing walls/sides of the slot so as to contact and frictionally engage both sides of the connection circuit board when assembled. The second and third portions may be located on the same or opposing walls of the slot.

The fourth portion may be or comprise one or more projections extending towards the circuit board such that the sensing electrode can pivot/rotate about/around the first portion and the fourth portion between the rest position and the first/second actuated position.

The non-conductive plastic material may be substantially flexible/deformable and resilient. Optionally, the conductive plastic material may also be substantially flexible/deformable and resilient. The sensing electrode may be configured to return to the rest position when the pressure or force is removed via the resilience of the non-conductive plastic material and/or the conductive plastic material.

The control element may be configured to detect one or more of movement/deformation, direction of movement/deformation, and/or amount of movement/deformation of the sensing electrode relative to (the or each sensing point on) the connection circuit board based on the one or more electrical signals. The control element may be shaped and configured to provide a push button function, a push/pull trigger or switch function, or a toggle switch.

The following features apply to the control systems of any of the first, second and/or third aspects of the invention.

The control system may further comprise a measurement module configured to measure the one or more electrical signals at the one or more sensing points. The measurement module may further be configured to detect a user interaction with the control element based on the one or more electrical signals. In the first or second aspect the measurement module may be configured to detect one or more of: a contact or touch from a user/operator, a contact/touch position, a speed and/or direction and/or amount of movement of said conductive object on/across the surface of the non-conductive plastic material relative to the one or more sensing points based on the one or more electrical signals. In the first or third aspect, the measurement module may be configured to detect one or more of: movement/deformation, direction of movement/deformation, and/or amount of movement/deformation of the sensing electrode relative to the or each sensing point on the connection circuit board based on the one or more electrical signals.

The one or more sensing points may be connected or connectable to the measurement module via one or more conductive tracks or traces on the connection circuit board. The conductive tracks may be or comprise a metal or metal alloy, or a conductive plastic or polymer. The conductive tracks may be printed and/or deposited in or on the connection circuit board, as is known in the art. The measurement module may be configured to measure changes in capacitance at the or each sensing point, e.g. individually, sequentially, and/or at all sensing points simultaneously.

The measurement module may comprise a capacitive sensing chip with one or more sensing or input channels for measuring changes in capacitance, such as a capacitive sensing micro-processor or micro-controller. The capacitive sensing chip may be configured to measure changes in capacitance at each sensing point connected to its input pin(s), e.g. based on the one or more electrical signals. The capacitance measurement may optionally be a frequency-based measurement. In the first or second aspect, the capacitance measurement may be based on self-capacitance of the sensing electrode. In the first or third aspect, the capacitance measurement may be based on the change in capacitance caused by the interaction of the sensing point on the connection board with the sensing electrode, e.g. the sensing electrode may be connected to a reference or ground point via one or more of the sensing points (e.g. the first sensing point) and conductive tracks and may interact capacitively with another sensing point (e.g. second sensing point) on the connection board, or vice versa.

The measurement module may further comprise a processing unit or chip configured to receive measurement data from the capacitive sensing chip for detecting or determining a user interaction with the control element based on the measurement data. The processing unit or chip may be in data communication with the capacitive sensing chip. The processing unit may be configured to store, process and/or analyse the measurement data. The processing unit may be or comprise one or more processors and one or more memories storing software and/or program instructions, that when executed or run on the one or more processors cause the processing unit to process and/or analyse the measurement data to detect or determine a user interaction. Alternatively or additionally, the processing unit may be in communication with a remote computing device running software configured to receive, process, store and/or analyse the measurement data from the processing unit. The processing unit may be or comprise a microcontroller or a microprocessor chip.

The measurement module may be connectable to an ECU of the vehicle. The measurement module may be in data communication with the ECU, e.g. using the specific types of protocols used by automotive ECUs. The measurement module may further be configured to provide one or more control signals associated with the detected user interaction(s) for the ECU. The ECU may then be able to control one or more functions of the vehicle based on the control signals generated in response to a user interaction with the control element.

The connection circuit board may be substantially flat and rigid. Alternatively, the connection circuit board may be substantially curved and/or flexible. The measurement module may be mounted or mountable on or to the connection circuit board directly. Alternatively, the measurement module can be separate from the connection circuit board and electrically connected to one or more conductive tracks on the connection circuit board via one or more flexible interconnects. Optionally or preferably, the flexible interconnects may be or comprises one or more printed circuit boards, flexible printed circuit boards, wires and/or cables.

The or each sensing electrode and the non-conductive plastic material may be formed by a moulding process, optionally or preferably, an injection moulding process. The non-conductive plastic material may be over-moulded onto the or each sensing electrode. The conductive plastic may be or comprise any one of: conductive thermoplastic polyurethane (TPU), conductive thermoplastic elastomer (TPE), or conductive acrylonitrile butadiene styrene (ABS). The non-conductive material may be or comprise any one of: non-conductive TPU, non-conductive TPE or non-conductive ABS. The non-conductive plastic material may be substantially flexible, resilient and/or deformable. The conductive plastic of the sensing electrode may be substantially rigid or flexible/deformable.

The connection circuit board may further comprises one or more light emitting devices and the control element may further comprise one or more substantially transparent (or at least partially transparent) plastic light guide portions that extend through at least a portion of the sensing electrode to guide light emitted from the one or more light emitting devices through the sensing electrode. Where there are a plurality of sensing electrodes, any number of sensing electrodes may comprise a light guide portion extending therethrough to guide light from one or more light emitting devices. The or each light emitting device may be connected to the measurement module and operated by the measurement module. The light emitting device(s) may be operated in response to a detected user interaction and/or in response to one or more signals received from the ECU e.g. a turn on signal received at vehicle start up or when the vehicle headlights are activated. The or each light emitting device may be or comprise a light emitting diode. The one or more light guide portions may be formed by a moulding process, optionally or preferably, an injection moulding process. The non-conductive plastic material may be over-moulded onto the sensing electrode and the one or more light guide portions.

The control system may further comprise a haptic feedback module in communication with the measurement module. The measurement module may be configured to control the haptic feedback module, e.g. to activate, in response to the detection of a user interaction. The haptic feedback module may be or comprise a vibration motor mounted on or to the connection circuit board.

The control system may comprise a plurality of said control elements. Each control element may be mountable on or to the same connection circuit board and connectable to the same measurement module.

The control systems of any of the first to third aspects may be integrated into almost any part of a vehicle interior, including but not limited to: a door handle; a door trim panel; a dashboard element; a centre console; an armrest; a headrest, a steering wheel; or a seat element.

Where the control element of the first or second aspect is integrated into a steering wheel of the vehicle, the or each sensing electrode may be configured to wrap around the steering wheel handle in the region where the driver grips or holds the steering wheel to provide finger position tracking functionalities, detect squeeze or grip pressure, detect hand positioning and whether a hand is off or on the steering wheel. The sensing electrode may comprise a plurality of sensing electrode portions spatially distributed around the steering wheel handle. Each sensing electrode portion may have a separate sensing point configured to provide an electrical signal in response to touch by an operator, such as touch by different fingers or portions of a finger. The electrode portions may be distributed in a pattern or sets corresponding to expected finger positions. The portion of the finger may be or comprise a proximal, intermediate or distal phalange of the finger. In this way, the position or vicinity of touch and/or finger movement can be determined from the electrical signal provided by each sensing electrode portion, which may indicate both the contact/touch areas as well as pressure the fingers or hand is exerting on the steering wheel.

The control system may comprise a non-conductive plastic body or shell for supporting one or more of said control elements in a control zone. The body or shell may define part of a vehicle interior. The non-conductive plastic material of the or each control element may be provided over/around the control zone, e.g. as an outer layer. The non-conductive plastic material of the or each control element may be a unitary piece of material provided over/around the control zone and at least part of the body as an outer layer. The plastic body or shell may be or comprise at least a part of one of the following parts of a vehicle interior: a door handle; a door trim panel; a dashboard element; a centre console; an armrest; a headrest, a steering wheel; or a seat element.

According to a fourth aspect of the invention, there is provided a vehicle comprising one or more control systems according to the first and/or second aspect. The vehicle may be an automobile. The vehicle may comprise an electronic control module (ECU) for controlling one or more user controllable vehicle functions. The vehicle may further comprise one or more user controllable sub-systems including one or more of: electric windows, motorised seats, central locking, an audio system, an entertainment system, a navigation system, a climate control system, a cruise control system, and a lighting system. One or more control systems according to the first, second and/or third aspect may be connected to the ECU so as to control the one or more vehicle functions in response to a user interaction with the or each control element.

According to a fifth aspect of the invention, there is provided a method of manufacturing a control system according to the first or second aspect. The method may comprise moulding a conductive plastic sensing electrode. The method may further comprise moulding the non-conductive plastic material on or over the sensing electrode. The method may further comprise providing a connection circuit board configured to electrically connect to the sensing electrode at one or more sensing points for measuring the one or more electrical signals, and secure the sensing electrode on or to the connection circuit board by means of frictional engagement. The method may comprise positioning the sensing electrode into a mounting position on the connection circuit board such that it is secured by means of frictional engagement and electrically connected to the connection circuit board at the one or more sensing points.

Positioning the sensing electrode may comprise engaging or frictionally engaging one or more fixing portions of the sensing electrode with one or more corresponding fixing elements of or on the connection circuit board to secure the sensing electrode to the connection circuit board by means of frictional engagement. Positioning may comprise engaging one or more electrical connectors of or on the connection circuit board with one or more corresponding contacting portions of the sensing electrode to electrically connect the sensing electrode to the connection circuit board at the one or more sensing points. The one or more electrical connectors may be configured to mechanically contact the one or more contacting portions of the sensing electrode. Engaging may comprise mechanically engaging the one or more electrical connectors of or on the connection circuit board with the one or more corresponding contacting portions of the sensing electrode. The one or more electrical connectors may be or comprise at least some of the one or more fixing elements. Positioning the sensing electrode may comprise frictionally engaging the one or more electrical connectors of/on the connection circuit board with the one or more corresponding contacting portions of the sensing electrode to electrically connect and secure the sensing electrode to the connection circuit board at the one or more sensing points.

According to a sixth aspect of the invention, there is provided a method of manufacturing a control system according to the first or third aspect. The method may comprise moulding a conductive plastic sensing electrode.

The method may further comprise moulding the non-conductive plastic material on or over the sensing electrode. The method may further comprise providing a connection circuit board comprising one or more sensing points for measuring the one or more electrical signals. The method may comprise positioning the sensing electrode into a mounting position on the connection circuit board such that it is electrically connected to the connection circuit board at the one or more sensing points.

Positioning the sensing electrode may comprise positioning the sensing electrode around an edge of the connection circuit boards so as to grip and/or frictionally engage the connection circuit board. Positioning the sensing electrode may comprise inserting a portion of the connection circuit board into a slot in the sensing electrode such that the sensing electrode grips and/or frictionally engages the connection circuit board between opposing walls of the slot. The sensing electrode may grip and/or frictionally engage both sides of the connection circuit board.

Features which are described in the context of separate aspects and embodiments of the invention may be used together and/or be interchangeable. Similarly, where features are, for brevity, described in the context of a single embodiment, these may also be provided separately or in any suitable sub-combination. Features described in connection with the systems may have corresponding features definable with respect to the method(s), and vice versa, and these embodiments are specifically envisaged.

BRIEF DESCRIPTION OF DRAWINGS

In order that the invention can be well understood, embodiments will now be discussed by way of example only with reference to the accompanying drawings, in which:

FIG. 2 shows an exploded view of the control system of FIG. 1a;

FIGS. 3a to 3i show examples of user interactions with control elements according to embodiments of the invention;

FIG. 11b shows an exploded view of the control system of FIG. 11 a;

Figure 1A:
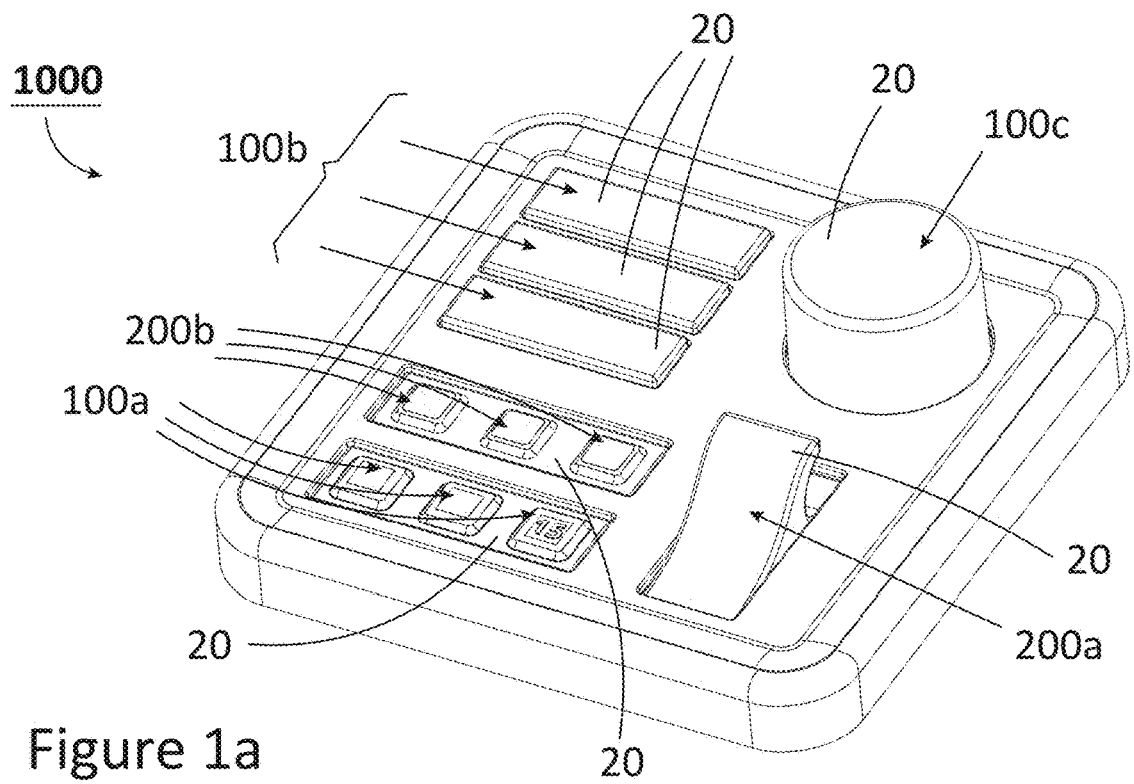
FIG. 1a shows an example control system comprising a plurality of control elements according to embodiments of the invention.

It should be noted that the figures are diagrammatic and may not be drawn to scale. Relative dimensions and proportions of parts of these figures may have been shown exaggerated or reduced in size, for the sake of clarity and convenience in the drawings. The same reference signs are generally used to refer to corresponding or similar features in modified and/or different embodiments.

DETAILED DESCRIPTION

Aspects and embodiments of the invention related to control systems for vehicle interiors with plastic-based control elements (i.e. user interface devices), such as buttons, switches and trackpads that provide the functionality of conventional capacitive touch and electromechanical actuation technologies but with significantly simplified construction that greatly simplifies and lowers the cost of manufacture and assembly.

The control elements comprise electrically conductive plastic sensing electrodes covered by a non-conductive plastic material/layer that a user can interact with by touching it or applying a force or pressure to move and/or deform the sensing electrode(s) beneath. The sensing electrodes can form a network of discrete sensing electrodes that are bound, supported and electrically isolated by the non-conductive plastic over-layer to form a complete seamless assembly. The plastic sensing electrode and non-conductive plastic material can be moulded and/or formed with specific three-dimensional (3D) shapes (e.g. cross-sections, profiles and/or surface contours) and/or arranged to provide control elements with a wide range of user interactive functionalities. In particular, the conductive plastic sensing electrodes can be designed and formed with specific 3D shapes which, for touch sensing applications allow the resistance between any two given points to be distinguishable and tailored in a way that may not otherwise be achievable in conventional metal electrode counterparts, and for pressure sensing applications allow the control element to exhibit certain intended mechanical properties, such as being moveable, flexible and/or deformable in response to an applied force or pressure to extend the functionality of the control interface technology.

Figure 1B:
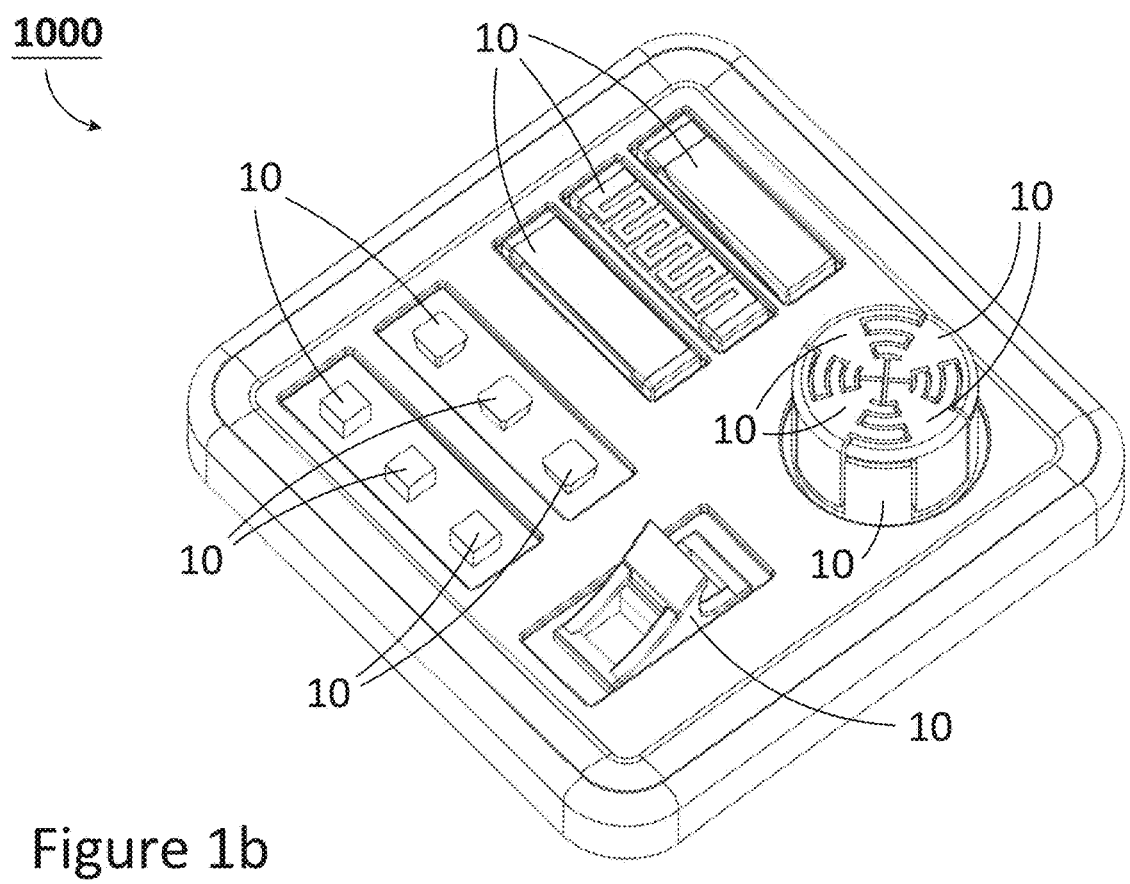
FIG. 1b shows the control system of FIG. 1a with the sensing electrodes visible.

FIG. 1a shows an example control system 1000 for a vehicle interior comprising a plurality of control elements of a first type 100 and a second type 200 that are suitable for a user or operator such as a driver or passenger to interact with to control one or more vehicle functions. The control elements 100, 200 comprise one or more conductive plastic sensing electrodes 10 configured to provide one or more electrical signals in response to a user interaction with the control elements 100, 200, and a non-conductive plastic material 20 provided on or over the or each conductive plastic sensing electrode 10. The non-conductive plastic material 20 is provided as an outer layer, over-layer or skin of the control elements 100, 200 that the user or operator interacts with (although one or more additional layers of non-conductive material, such as fabrics, coatings, paints, coloured plastics may be provided on or over the plastic over-layer 20, provided they do not affect the functionality of the control element 100, 200). FIG. 1a shows the system 1000 with the control elements 100, 200 covered with the plastic over-layer 20, and FIG. 1b shows the system 1000 without the over-layer 20 to show the underlying sensing electrodes 10 of the control elements 100, 200.

Figure 2:
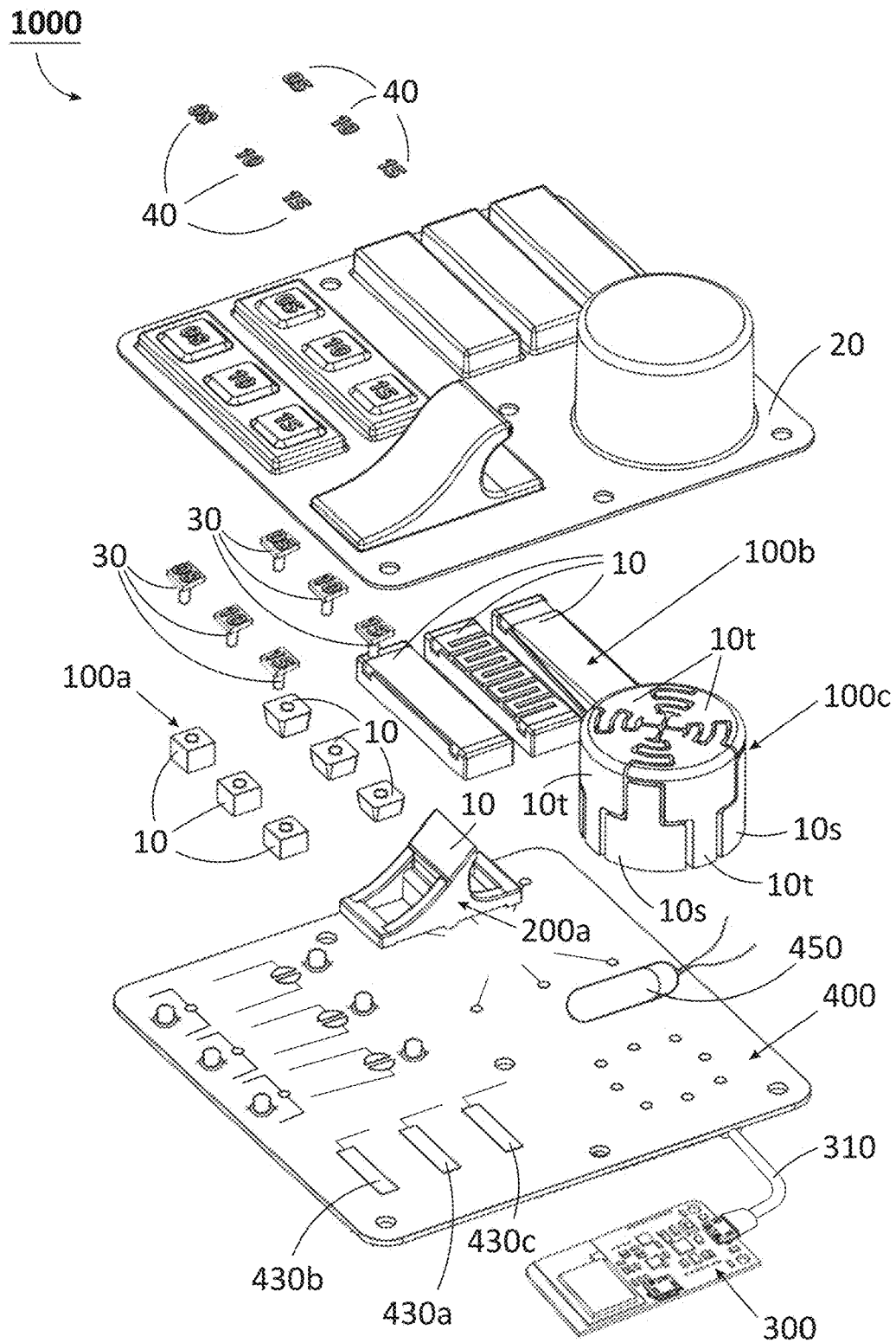

FIG. 2 shows an exploded view of the control system 1000. The control system 1000 also comprises a measurement module 300 for measuring the one or more electrical signals provided by the sensing electrode(s) 10 of each control element 100, 200 and a connection circuit board 400 for mounting the sensing electrodes 10 on/to and connecting the sensing electrodes 10 to the measurement module 300. The measurement module 300 is connected to sensing electrodes 10 by conductive tracks or traces 410 on the connection circuit board 400. The measurement module 300 may be mounted on/to the connection circuit board 400 or may be separate from the connection circuit board 400 and connected to it via a flexible interconnect 310, such as a USB-type cable as shown in FIG. 2.

The measurement module 300 is connectable to an electronic control unit (ECU) of a vehicle (not shown) and is configured to determine one or more user interactions with the control element(s) 100, 200 based on the measured electrical signals and generate/provide one or more control signals for the ECU associated with the detected user interaction(s). The ECU may then be able to control one or more functions of the vehicle based on the control signals generated in response to a user interaction with the control element 100, 200.

The first type of control element 100 is or comprises a capacitive touch sensor that is configured to provide one or more electrical signals in response to a conductive object 500 (such as a user's finger(s) or thumb) being in contact or close proximity with the surface of the plastic over-layer 20 such that it interacts capacitively with the underlying sensing electrode(s) 10. The second type of control element 200 is or comprises a mechanical pressure sensor that is configured to provide one or more electrical signals in response to a pressure or force applied on/to the control element 200 that moves and/or deforms the sensing electrode(s) 10 relative to the connection circuit board 400. In this case, movement and/or deformation of the sensing electrode(s) 10 changes a capacitive interaction between the sensing electrode(s) 10 and the connection circuit board 400 beneath or adjacent to the sensing electrode(s) 10, as will be explained in more detail below. The object 500 interacting with the pressure sensing control element 200 may therefore be conductive or non-conductive (e.g. a user or operator may be operate the control element 200 irrespective of whether he/she is wearing gloves or not). The operation of the two types of control elements 100, 200 will be described in more detail below with reference to FIGS. 4 to 7.

The sensing electrode(s) 10 and the non-conductive plastic over-layer 20 are formed by an injection moulding process. The plastic over-layer 20 may be over-moulded onto the sensing electrode(s) 10. The sensing electrode 10 may be or comprise any one of: conductive thermoplastic polyurethane (TPU), conductive thermoplastic elastomer (TPE), or conductive acrylonitrile butadiene styrene (ABS). The plastic over-layer 20 may be or comprise any one of: non-conductive TPU, non-conductive TPE or non-conductive ABS. For the touch sensing control elements 100 where movement and/or deformation of the sensing electrode 10 is not required, the conductive plastic of the sensing electrode 10 and the non-conductive plastic material 20 can be substantially rigid. However, the non-conductive plastic material 20 may instead be substantially flexible, resilient and/or deformable to provide certain tactile properties. For the mechanical pressure sensing control elements 200, the non-conductive plastic material 20 is substantially flexible, resilient and/or deformable to allow the underlying sensing electrode 10 to move and/or deform. The conductive plastic of the sensing electrode 10 can be substantially rigid and/or at least partially deformable. As such, in the system 1000 comprising both types of control elements 100, 200 the over-layer 20 is substantially flexible, resilient and/or deformable. It will be appreciated that the sensing electrode 10 may be formed with a substantially rigid material but may be configured to exhibit at least partially deformability/flexibility by virtue of its shape. In any case, the conductive plastic of the sensing electrode 10 should be more rigid than the plastic over-layer 20.

The control elements 100, 200 can be configured to provide a range of different user interactive functionalities. For example, the control system 1000 shown in FIGS. 1a, 1b and 2 comprises a variety of capacitive touch sensing control elements 100 configured as touch buttons 100a, slider bars 100b and a static rotary knob 100c, as well as a mechanical pressure sensing control elements 200 configured as push-pull switches or triggers 200a and push buttons 200b. The operation of these control elements 100, 200 will be described in detail more detail below.

Examples of the different types of user interactions or gestures that the control elements 100, 200 can detect are shown in FIGS. 3a-i, where movements and directions of applied force by a user's finger(s)/thumb 500 are indicated by arrows. FIG. 3a shows a user interacting with touch sensing control elements 100a configured as touch buttons, and pressure sensing control elements 200b configured as push buttons. The touch button control element 100a is configured to detect when a user's finger/thumb 500 is in contact or close proximity with the surface of the plastic over-layer 20 covering the or each sensing electrode 10. The push button control element 200b is configured to detect when a when a user applies a force or pressure that moves and/or deforms (i.e. actuates) the sensing electrode 10 in a single direction (in this case the same direction of the applied force/pressure). The push gesture moves/deforms the sensing element 10 from a rest position to an actuated position. A touch or push button control element 100a, 200b may be used to control certain vehicle functions with simple "touch" and/or "touch and hold" gestures. Suitable vehicle functions include but are not limited to: interior illumination control, wiper control, gear selection, bonnet release, and control no/off functions (e.g. lane departure warning, warning lights, tailgate open/close, engine start/stop, heated function on/off, voice control and phone control selection, media controls, cruise control, speed limiter, etc.). For example, certain vehicle functions may be controlled on/off by "touching on" and "touching off", certain vehicle functions having a range of discrete intermediate settings between off and on states may be controlled by repetitive touches to cycle through each intermediate setting, and certain vehicle functions with a variable and/or continuous range of settings may be controlled using a "touch and hold" gesture.

FIG. 3b shows a user interacting with a touch sensing control element 100b configured as a slider bar. The slider bar control element 100b is configured to detect contact/proximity, contact position, direction of movement and/or amount of movement of the user's finger/thumb 500 on/across the surface of the over-layer 20 predominantly along a single path (defined by the shape or geometry of the slider bar). The path may be substantially linear as shown, or curved (not shown). In this way, the slider bar control element 100*b* can detect movement and sliding finger/thumb gestures in certain directions, and be used to control certain vehicle functions with a variable and/or continuous range of settings with "slide up" and "slide down" gestures (or left and right etc.) as well as simple touch and/or touch and hold gestures. In the example shown, the slider bar 100*b* has a substantially elongate touch interactive top surface 20*t*, however, it will be appreciated that other shapes and configurations are possible, for example as shown in the control element 200*h* of FIG. 8.

FIG. 3*c* shows a user interacting with a touch sensing control element 100*c* configured as a static rotary knob. The static rotary knob control element 100*c* has a raised 3D structure with a curved side or side surface 20*s*, which provides a similar function to the slider bar 100*b*. The static rotary knob control element 100*c* is configured to detect contact/proximity, contact position, direction of movement and/or amount of movement of the user's finger(s)/thumb 500 around the side surface 20*s* along a predominantly single path (defined by the shape or geometry of the static rotary knob). In this way, the static rotary knob can detect rotational or twisting interactions/gestures and replicate the functionality of a mechanical rotary knob without the control element 100*c* rotating. Suitable vehicle functions for the slider bar 100*b* and static rotary knob 100*c* include but are not limited to: audio/media controls (e.g. volume control, system navigation), interior illumination, heated functions, climate control (e.g. air blower speed and temperature adjustment), instrument panel controls, infotainment system navigation (e.g. scrolling through lists/options displayed in the vehicle interior etc.), driving mode selection, wiper operation etc.

FIG. 3*d* shows a user interacting with a touch sensing control element 100*d* configured as a trackpad. The trackpad control element 100*d* has an extended touch interactive top surface 20*t* and is configured to detect contact/proximity, contact position, direction and/or amount of movement of the user's finger(s)/thumb 500 on/across the surface of the over-layer 20 along multiple paths and/or directions (which may be linear, curved or circular paths). In this way, the trackpad control element 100*d* can detect movement and sliding finger/thumb gestures in multiple directions across an extended area (defined by its top surface 20*t*), and can be used to control certain vehicle functions with a variable and/or continuous range of settings, e.g. with slide up, slide down, slide left, slide right, clockwise slide and/or anti-clockwise slide, as well as simple touch and/or touch and hold gestures. Suitable vehicle functions include but are not limited to mirror adjustment controls, driver and passenger seat position, function selection confirmation, instrument panel controls, infotainment system navigation, audio controls, media controls, etc. The static rotary knob control element 100*c* may also be configured with a trackpad function on the top surface 20*t* (described in more detail with reference to FIG. 4).

FIGS. 3*e* and 3*f* show a user interacting with mechanical pressure sensing control elements 200*a*, 200*c* configured as a push-pull switches or triggers. The push-pull control elements 200*a*, 200*c* are configured to detect a force or pressure applied to the control element 200*a*, 200*c* that moves and/or deforms (i.e. actuates) the sensing electrode 10 in at least two directions, as shown. In this case, the different push and pull gestures move/deform the sensing element 10 from a rest position to a first and second actuated position. The push-pull control elements 200*a*, 200*c* are configured to detect movement/deformation, direction of movement/deformation, and/or the amount of movement/deformation of the sensing electrode. The Analogue not digital . . . . Both control elements 200*a*, 200*c* operate in the same way but are configured to respond to different directions of applied force/pressure or types of push/pull gestures. The push-pull control element 200*a* in FIG. 3*e* is configured to actuate in response to substantially downward and upward push/pull gestures or forces, whereas the control element 200*c* in FIG. 3*f* is configured to actuate in response to substantially lateral push/pull gestures or forces. In particular, the example control elements 200*a*, 200*c* shown comprise a handle portion 210*a*, 210*c* for the user to handle, grip and/or manipulate so as to apply the force/pressure to move/deform the sensing electrode. The handle portions 210*a*, 210*c* are shaped and configured according to the desired push/pull gesture, as is shown and known in the art. Suitable vehicle functions include but are not limited to: window up/down controls, driver and passenger seat position adjustment, doors lock/unlock, child safety lock/unlock, illumination control, tailgate opening/closing, instrument panel controls, infotainment system navigations, audio controls, media controls, driving mode selection, gear selection, bonnet release, etc.

FIG. 3*g* shows a user interacting with another push button control element 200*d* FIG. 3*h* shows a user interacting with a similar push-pull control element 200*e* integrated into a steering wheel 600 so as to actuate in response to a user applying various forces/pressures while gripping the steering wheel 600 (and without taking his/her hand off the steering wheel 600), as shown.

FIG. 3*i* shows an example of a user interacting with touch sensing and mechanical pressure sensing control elements 100*e*, 200*e* integrated into a steering wheel 600 while gripping or holding the steering wheel 600. In this case, the steering wheel 600 comprises one or more touch sensing control elements 100*e* that can detect when a user is holding steering i.e. hands on/off detection, grip strength detection, finger tracking and/or hand position, as will be described in more detail with reference to FIG. 13. Squeeze gestures and/or tap or double tap gestures on specific areas of the control element 100*e* in/on the steering wheel 600 can be used to provide basic functionalities, including but not limited to: volume controls, media controls, window controls, etc. Driver's squeeze strength can also be used to monitor patterns of tiredness and/or sleepiness for improved driving safety.

The control system 1000 is specifically configured to be easily manufactured and assembled at low cost. The conductive plastic sensing electrodes 10 and the non-conductive plastic over-layer can be formed by injection moulding. In particular, the sensing electrode(s) 10 of the control elements 100, 200 can be electrically connected to the connection circuit board 400 by means of mechanical contact or engagement, thus eliminating the need for solder joints, wire bonding and/or other forms of permanent electrical connection. This means that to assemble the system 1000, the sensing electrode(s) 10 may simply be positioned, pushed and/or slid into place on the connection circuit board 400 to provide an electrical connection to the connection circuit board 400. In addition, the connection circuit board 400 is configured to secure the sensing electrode(s) 10 of the touch sensing control elements 100 to the connection circuit board 400 by means of frictional engagement. In this way, positioning, pushing and/or sliding the sensing electrode(s) 10 of the touch sensing control elements 100 into place to effect the mechanical electrical connection(s) also causes the connection circuit board 400 to frictional engage with the sensing electrode(s) 10 to secure and retain it/them in place (and thus maintaining the mechanical electrical connection) for the remaining assembly steps and during use of the system 1000 once installed into a vehicle.

Figure 4:
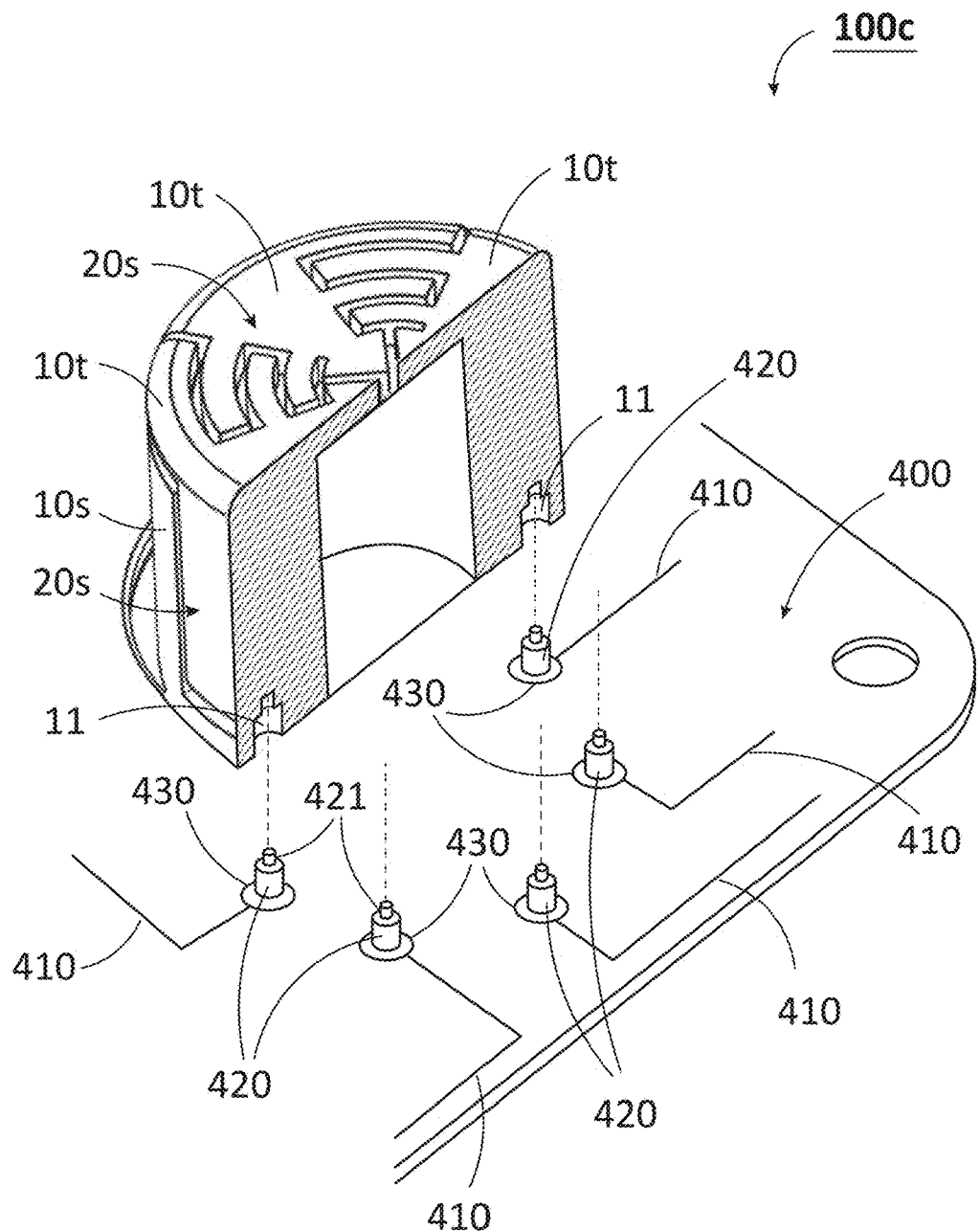
FIG. 4 shows a means of connecting a sensing electrode of a touch sensing control element to a connection circuit board according an embodiment of the invention.

FIG. 4 shows a capacitive touch sensing control element 100c without the plastic over-layer 20 to show its operation and assembly in more detail. Each sensing electrode 10 is electrically connected to the connection circuit board 400 at one or more sensing points 430 associated with a respective sensing electrode 10 for measuring the one or more electrical signals. The sensing points 430 are connected to the measurement module 300 via the conductive tracks 410. Where a sensing electrode 10 is associated with more than one sensing point 430, each sensing point 430 may be associated with a different portion of the sensing electrode 10 and provides a separate electrical signal to the measurement module 300 in response to the user interacting with the control element 100.

Each sensing electrode 10 is electrically connected to the sensing points 430 by an electrical connector 420 configured to mechanically contact the sensing electrode 10. As such, the sensing points 430 may comprise an electrical connector 420. The electrical connector 420 comprises a substantially rigid mating portion 421, such as a metal pin/projection, configured to mechanically contact, deform and/or penetrate a corresponding contacting portion 11 of the sensing electrode 10. Optionally, the mating portion 421 may be biased towards to the contacting portion 11, e.g. the electrical connector 420 may be a pogo pin connector with a spring loaded mating portion 421. The electrical connectors 430 are also configured to frictionally engage with the sensing electrode 10 to secure it to the connection circuit board 400. In the example shown, this is provided by a male-female connection. The electrical connector 420 is or comprises a projection that projects from the connection circuit board 400 and the contacting portion 11 comprises an opening or recess configured to receive and frictionally engage the electrical connector 420 and make the mechanical electrical connection. Using the electrical connectors 420 to provide the frictional engagement is a convenient and reliable way to secure and connect the sensing electrode(s) 10 to the connection circuit 400. However, it will be appreciated that other mating/contacting configurations may be used. For example, the mating portion 421 may be or comprise an opening or recess and the contacting portion 11 may be or comprise a projection configured to mechanically contact and frictionally engage with the recess/opening. Alternatively or additionally, separate securing elements may be used to frictionally engage with the sensing electrode 10, e.g. the connection circuit board 400 may comprise male securing elements that frictionally engage with corresponding female securing portions of the sensing electrode 10, or vice versa.

The operating principle of the touch sensing control elements 100 is the following. The one or more electrical signals are provided in response to a change in capacitance of a sensing electrode 10 caused by a conductive object 500, such as a user's finger or thumb, being in proximity to or in contact with the non-conductive plastic over-layer 20 covering the sensing electrode 10. The conductive object 500 interacts capacitively with the underlying sensing electrode 10. This interaction changes the self-capacitance of the sensing electrode 10, which can be measured at the one or more sensing points 430 by the measurement module 300. The measured change in self-capacitance of the sensing electrode 10 is proportional to the overlap area between the conductive object and the sensing electrode 10 and inversely proportional to the distance between them. In addition, the conductive plastic of the sensing electrode(s) 10 has a relatively high electrical resistivity (typically in the range of substantially $1 \times 10^2$-$1 \times 10^6$ Ohm·cm), such that the measured change in capacitance at an individual sensing point 430 varies with the distance between the location of the conductive object and the individual sensing point 430. The above properties allow a touch sensing control element 100 to detect contact/proximity, contact position and direction and/or amount of movement of a conductive object on/across the surface of the plastic over-layer 20 relative to the one or more sensing points 430.

The example static rotary knob control element 100c shown in FIG. 4 comprises eight sensing electrodes 10, that interlock and/or interdigitate in one or more directions to form a raised 3D structure with a top surface 20t and side surface 20s. Four of the sensing electrodes labelled 10t interlock/interdigitate to make up the top surface 20t and part of the side surface 20s, while the remaining four sensing electrodes labelled 10s make up the rest of the side surface 20s. As the user runs or slides their finger(s)/thumb around the plastic over-layer 20 covering the side surface 20s (not shown), the finger(s)/thumb overlaps each sensing electrode 10t, 10s sequentially and in a continuously variable amount thus providing a unique set of electrical signals that can be measured by the measurement module 300 at the sensing points 430 and used to determine the contact position, direction and/or amount of movement around the side surface 20s. The top surface 20t of the control element 100c shown in FIG. 4 provides a trackpad function. Similarly, as the users runs or slides their finger/thumb on/across the plastic over-layer 20 covering the top surface 20s (not shown) in a linear or circular movement, the finger/thumb overlaps each different sensing electrodes 10t and in a continuously variable amount thus providing a unique set of electrical signals that can be measured by the measurement module 300 at the sensing points 430 and used to determine the contact position, direction and/or amount of movement on/over the top surface 20s.

The above described operation principle can also be applied to a slider bar control element 100b. Where the slider bar control element 100b comprises a single sensing electrode 10, as shown in FIG. 2, the contact position, direction and/or amount of movement on/over the surface of the over-layer 20 can be determined by the measurement module 300 via the dependence of the measured self-capacitance at an individual sensing point 10 with the distance of the finger/thumb from an individual sensing point 10.

Figure 5A:
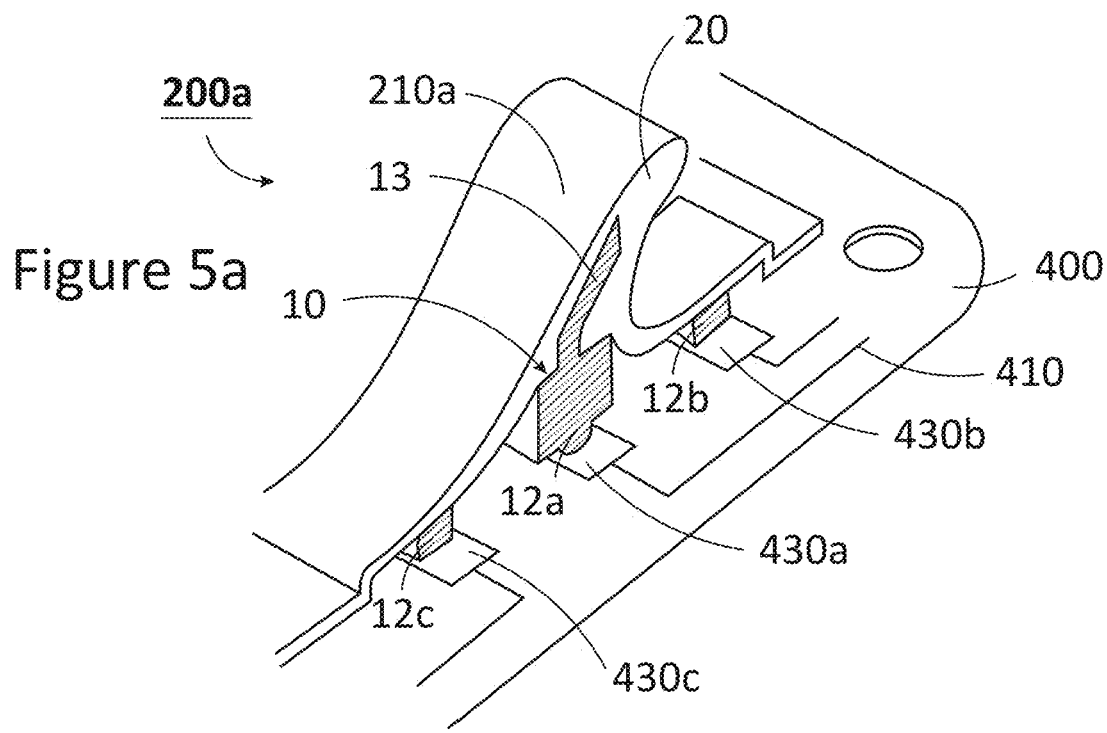
FIGS. 5a to 5c show cross-sectional views of an example mechanical pressure/force sensing control element according to an embodiment of the invention.
Figure 5B:
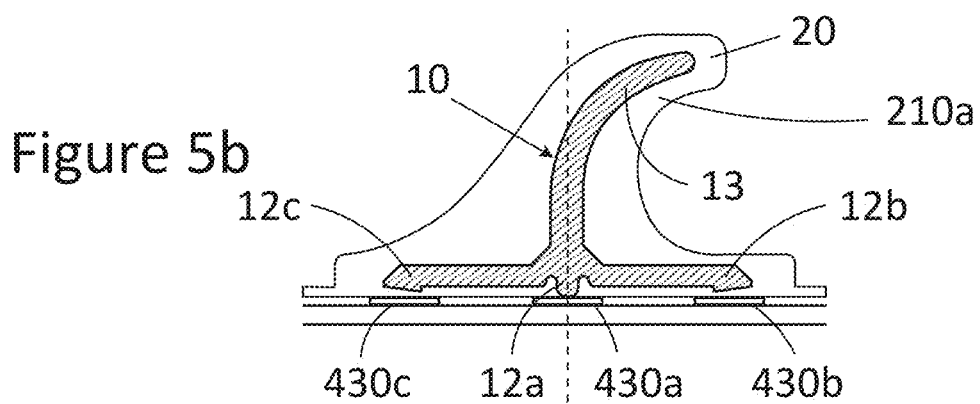
Figure 5C:
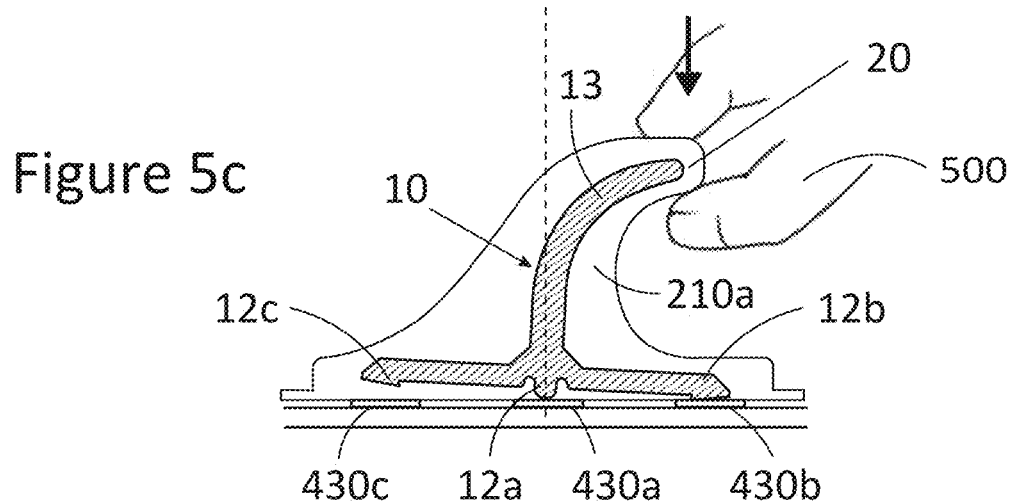

FIGS. 5a-5c show a cross-sections through an example push-pull control element 200a to illustrate its operation. The sensing electrode 10 comprises a first portion 12a, a second portion 12b and a third portion 12c. Each portion 12a, 12b, 12c is associated with a separate sensing point 430a, 430b, 430c on the connection circuit board 400. The sensing points 430a, 430b, 430c comprise conductive pads or electrodes which are connected to the measurement module 300 via the conductive tracks 410. The first sensing point 430a faces the first portion 12a, the second sensing point 430b faces the second portion 12b and the third sensing point 430c faces the third portion 12c. The first portion 12a mechanically contacts the first sensing point 430a which serves to ground the sensing electrode 10, while the second and third portions 12b, 12c are movable and/or deformable relative to the respective second and third sensing points 430b, 430c in response to a pressure or force applied to the sensing electrode 10. Movement of the second and/or third portions 12b, 12c causes a change in the capacitance between the sensing electrode 10 and the second and/or third electrodes 430b, 430c that can be measured by the measurement module 300 between the first and second sensing points 430a, 430b and/or the first and third sensing points 430a, 430c respectively. Alternatively, the measured capacitance may be a self-capacitance of the sensing electrode 10 that varies as the interaction with the second/third sensing points 430b, 430c changes in response to movement/deformation of the second/third portions 12b, 12c. In that case, the second and third sensing points 430b, 430c may be grounded and the self-capacitance is measured at the first sensing point 12a.

The sensing electrode 10 is movable and/or deformable in response to a pressure or force applied to the sensing electrode 10 from a rest position shown in FIG. 5b to a first actuated position shown in FIG. 5c and to a second actuated position (not shown). In the rest position, both the second and third portions 12b, 12c are separated from the respective second and third sensing points 430b, 430c by a distance, which may be the same or different for the second and third portions 12b, 12c. In the first actuated position, the second portion 12b is positioned closer to or in contact with the second sensing point 430b. In the second actuated position, the third portion 12c is positioned closer to or in contact with the third sensing point 430c. The capacitance between the sensing electrode 10 and the second sensing point 430b is inversely proportional to the distance between the second portion 12b and the second sensing point 430b (similarly for the capacitance between the sensing electrode 10 and the third electrode 430c). As such, in the control element 200a any force or pressure applied to the sensing electrode 10 that changes the distance between the respective portions 12b, 12c, and sensing points 430b, 430c may provide a change in capacitance that can be measured by the measurement module 300. Contact with the second/third electrodes 430b, 430c is not required. A continuous range of electrical signals may be provided for movements between the rest position and the first/second actuated position in which the second/third portions 12b, 12c contact the second/third sensing points 430b, 430c.

The first portion 12a comprises one or more projections that separate the second and third portion 12b, 12c from the second and third sensing points 430b, 430c in the rest position. Because the second and third portions 12b, 12c extend from or are arranged at a distance from the first portion 12a, the sensing electrode 10 can to move between the rest and first/second actuated positions by pivoting about/around the first portion 12a, as shown in FIG. 5c. In other examples, movement between the rest and first/second actuated positions may result from a combination of pivoting and at least partial deformation of the sensing electrode 10 with respect to the first portion 12a. The control element 200a comprises a handle portion 210a that projects or extends away from the connection circuit board 400 for the user to handle, grip and/or manipulate via a push, pull and/or lift/lower interaction/gesture so as to apply the force/pressure to move/deform the sensing electrode 10, as indicated in FIG. 5c. The sensing electrode 10 comprises a force transferring portion 13 that extends into the handle portion 210a to transfer the force or pressure to the sensing electrode 10 (namely the first and/or third portion). As can be seen, the force transferring portion 13 comprises a projection or extension that provides a lever action to apply a torque to the sensing electrode 10 so as to move, pivot and/or deform the second and/or third portion 12b, 12c around/about the first portion 12a. In the example shown, the handle portion 210a and force transferring portion 13 are substantially curved so that the control element 200a can actuate in response to substantially upward/downward interactions/gestures. However, it will be appreciated that the control element 200a can be configured to actuate in response to substantially lateral interactions/gestures via a suitable shaped handle portion 210a and force transferring portion 13, e.g. the handle portion 210c of control element 200c shown in FIG. 3f. Note that the control element 200c shown in FIG. 3f is identical to the control element 200a shown in FIGS. 5a-5b save for the shape of the handle portion 210c and force transferring portion 13 that extends substantially straight up, in a perpendicular direction to the connection circuit board 400.

Although FIGS. 5a-5c show a push-pull control element 200a having two actuated positions and a handle portion 210a, it will be appreciated that further actuated positions are possible by adding additional portions to the sensing electrode 10 that extend from or are arranged at a distance from the first portion 12a. Further, the handle portion 210a is not essential, e.g. the user may instead apply force or pressure directly over the second and/or third portion 12b, 12c. Further still, it will be appreciated the third portion 12c and third sensing point 430c are not essential. For example, a push button control element 200b, 200d with a single actuated position may be constructed with just a first and second portion 12a, 12b and first and second sensing points 430a, 430b. In this case, the sensing electrode 10 of a push button control element 200c may be configured to move between the rest and first actuated position by deformation of the sensing electrode 10 alone. A first portion 12a of the push button's sensing electrode 10 may be configured to contact the first sensing point 430a and the second portion 12b may be configured to be deformable/moveable to change the distance from the second sensing point 430b in response to a force/pressure applied to/over the second portion 12b. In an alternative configuration (not shown), the sensing electrode 10 of the push button control element 200b may be electrically floating (i.e. not grounded or connected to sensing point in the rest position) and provide a change in the measured electrical signal when it is moved/deformed into contact with the first and/or second sensing points 430a, 430b.

Figure 6A:
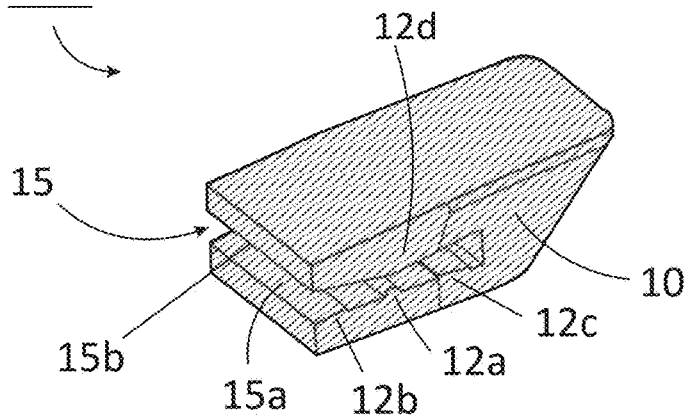
FIGS. 6a to 6c show another example mechanical pressure/force sensing control element according to an embodiment of the invention.
Figure 6B:
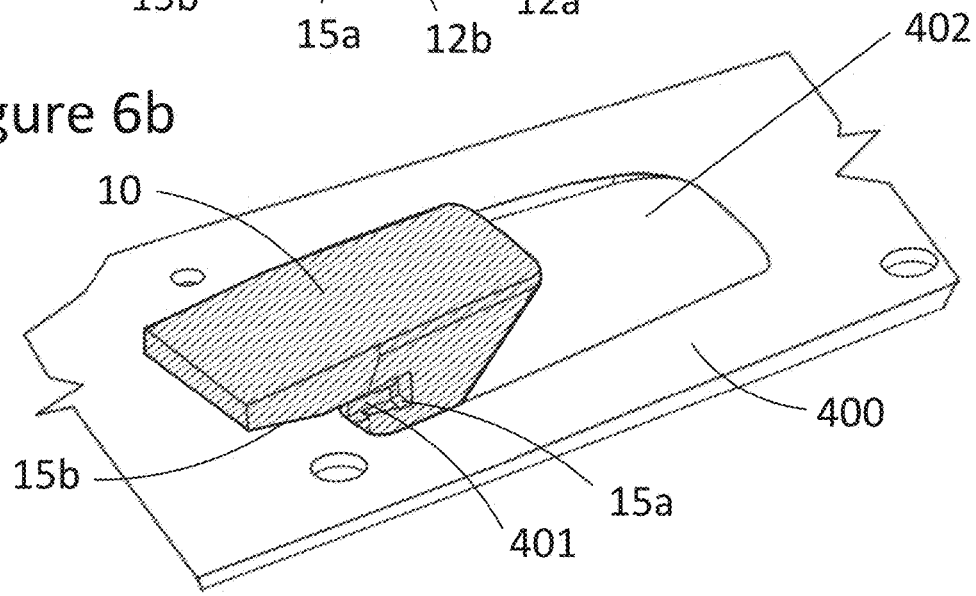
Figure 6C:
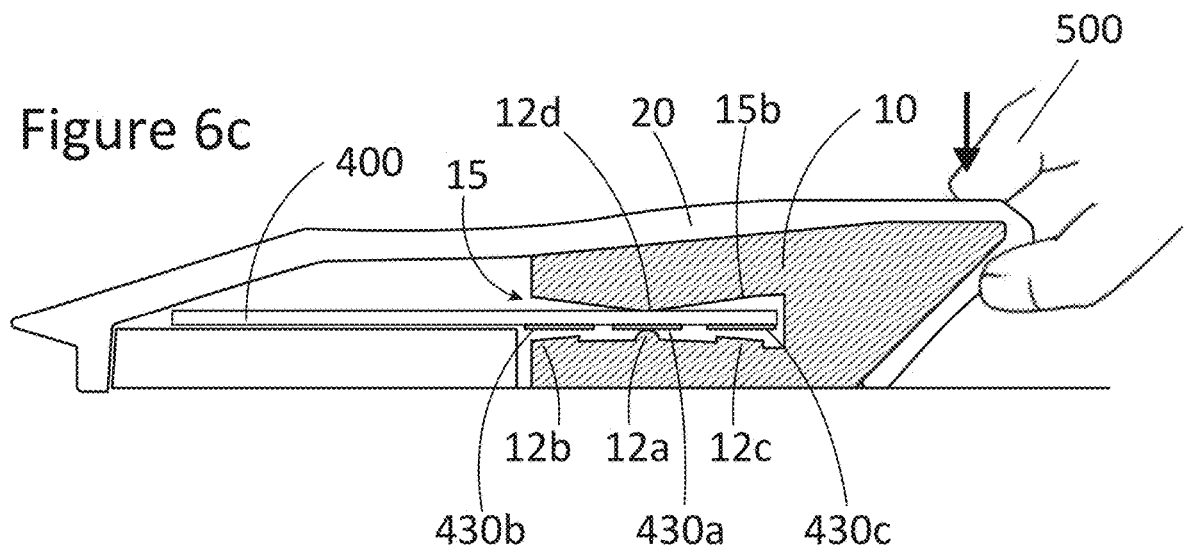

The push-pull control element 200a shown in FIGS. 5a-5c is configured to be mounted on or to one side (a first side) of the connection circuit board 400. FIGS. 6a-6c show an alternative configuration of a push-pull control element 200f that is configured to be mounted on or to an edge of the connection circuit board 400. In this case, the sensing electrode 10 comprises a slot 15 for receiving and frictionally engaging a portion 401 of the connection circuit board 400 between first and second opposing walls 15a, 15b of the slot 15, as shown in FIGS. 6a and 6b. The control element 200f otherwise operates in the same way as the control element 200a shown in FIG. 5a-5c. The portion 401 may be provided at an outer edge of the connection circuit board 400 or an edge formed/provided by an opening 402 in the connection circuit board 400 as shown in FIG. 6b. The first, second and third portions 12a-12c of the sensing described above are formed/located on a first opposing wall 15a of the slot 15 and the first, second and third sensing points 430a-430c are located on the portion 401 of the connection circuit board 400 facing the respective first, second and third portions 12a-12c. The second opposing wall 15b comprises an extruded portion 12d configured to contact the opposite side (a second side) of the connection circuit board 400 to the first portion 12a so as to grip and/or frictionally engage the connection circuit board 400 between the first portion 12a and the extruded portion 12d. In this way, the sensing electrode 10 can be mounted and secured to the connection circuit board 400 by pushing and/or sliding the sensing electrode 10 into place, thus greatly simplifying assembly. The extruded portion 12d is located substantially opposite the first portion 12a and comprises a projection extending towards the connection circuit board 400 such that the sensing electrode can pivot/rotate about/around the first portion 12a and the extruded portion 12b between the rest position and the first/second actuated positions.

Although the second and third sensing points 430b, 430c are located on the same side (the first side) of the connection circuit board 400 in the control element 200f of FIGS. 6a-6c, in an alternative configuration the second and third sensing points 430b, 430c can be located on opposite sides of the connection circuit board 400 (not shown). In this case, one of the second and third portions 12b, 12c would be formed/located on the first opposing wall 15a of the slot 15 and the other of the second and third portions 12b, 12c would be formed/located on the second opposing wall 15a of the slot 15. In use, a user grips the end of the push-pull control element 200f overhanging the edge of the connection circuit board 400 and applies a force or pressure to move the sensing electrode 10 between the rest and first or second actuated positions, as shown in FIG. 6c. As described above with reference to the control element 200a of FIGS. 5a-5c, where only one actuation position is required, such as with a push or pull button/trigger control element, the third electrode 430c and third portion 12c can be dispensed with (and the first and second sensing points 430a,430b may be located on the same or opposite sides of the connection circuit board 400). Further, although the example shown in FIGS. 6a-6c responds to substantially upward/downward push-pull interactions/gestures, it will be appreciated that the control element 200f can be configured to respond to substantially lateral push-pull interactions/gestures, e.g. by incorporating a handle portion (not shown) similar to that shown in FIG. 3f.

Figure 7:
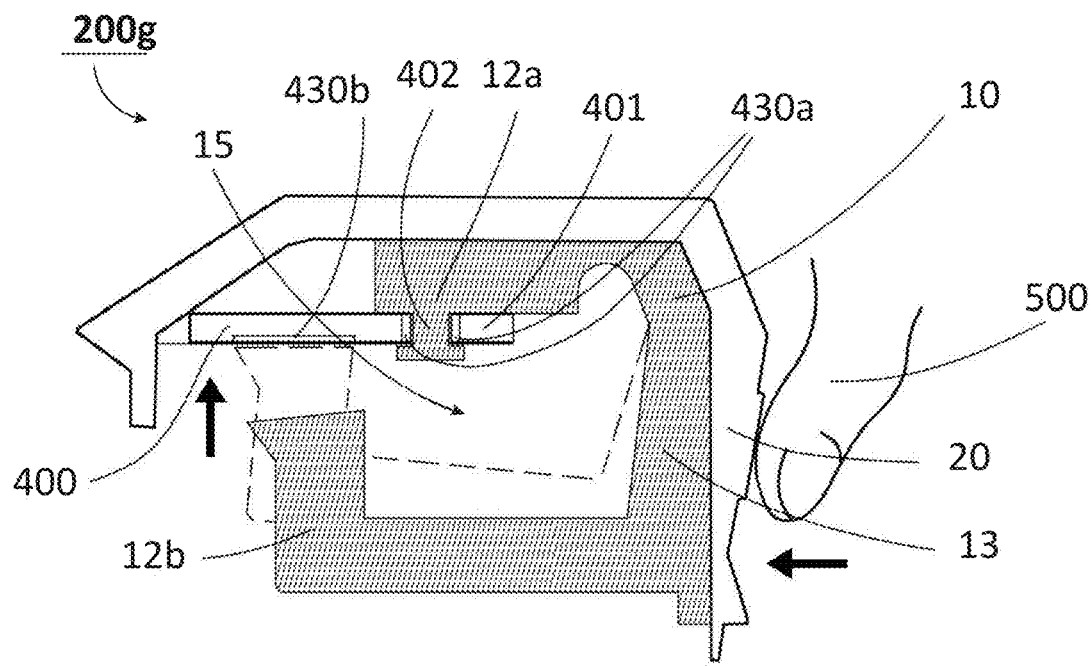
FIG. 7 shows another example mechanical pressure/force sensing control element according to an embodiment of the invention.
Figure 8:
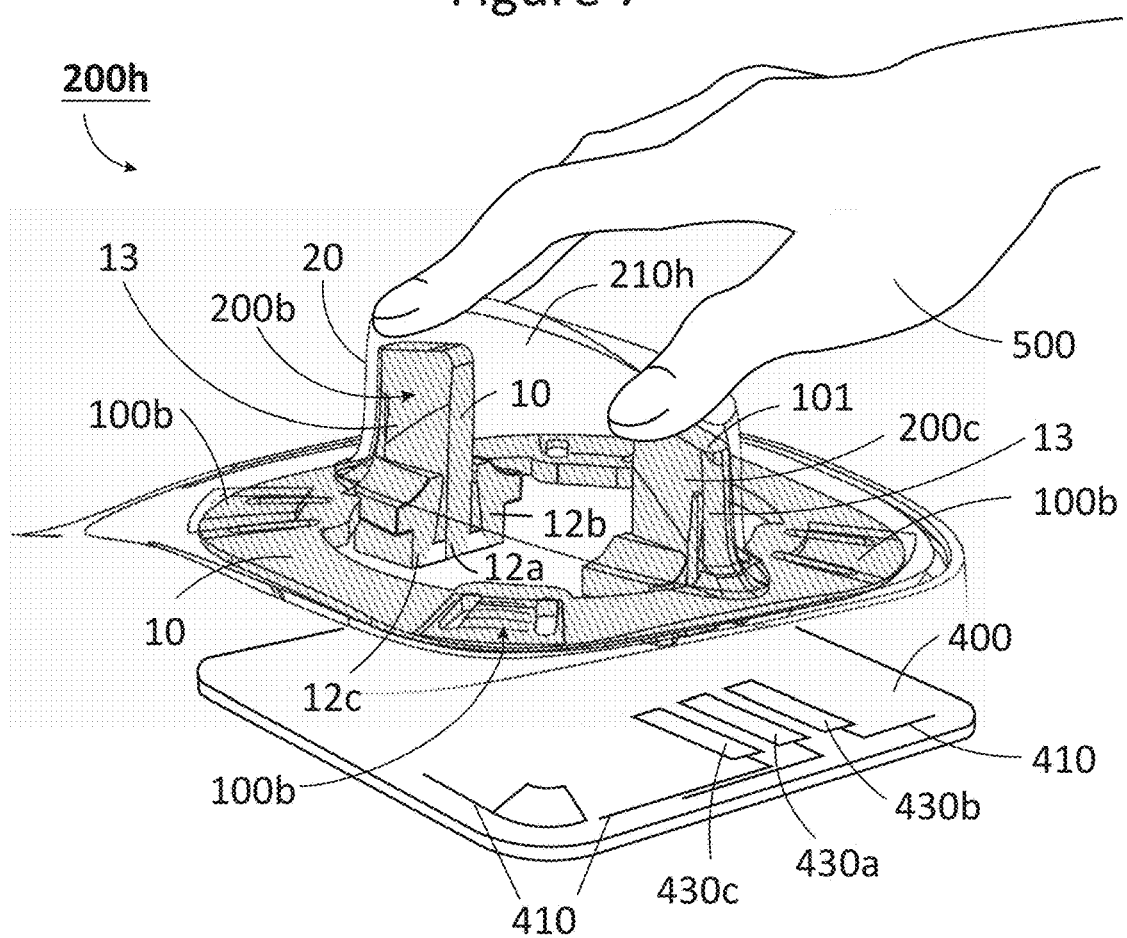
FIG. 8 shows another example mechanical pressure/force sensing control element according to an embodiment of the invention.

FIGS. 7 and 8 show further configurations of a mechanical pressure sensing control element 200. The control element 200g shown in FIG. 7 is configured to detect pressing interactions/gestures with a single actuated position. Similar to FIG. 6(c), the press control element 200g comprises a sensing electrode 10 comprising a slot 15 for receiving and frictional engaging a portion 401 of the connection circuit board 400. The sensing electrode 10 comprises a first portion 12a and a second portion 12b located on opposing sides of the slot. The first and second portions 12a, 12b are connected by a force transferring portion 13. The connection circuit board 400 comprises a first and second sensing point 430a and 430b, wherein the first sensing point 430a is connected with the measuring module 300 via a conductive track and the second sensing point 430b is preferably a ground/reference electrode. The first sensing point 430a comprises a through-hole or opening 402, and the first portion 12a comprises a complementary projection configured to frictionally engage with the opening 402 and mechanically contact the first sensing 430a. The sensing electrode 10 is configured to be substantially deformable and flexible to the extent that the user can bend/deform the force transferring portion 13 by pressing the non-conductive material 20 at the corresponding location. As such, the second portion 12a of the control elements 200g will move from its rest position to its actuated position in order to contact the second electrode 430b on the connection circuit board 400. The movement causes a change in the capacitance between the sensing electrode 10 and the second sensing point 430b that can be measured by the measurement module 300 between the first and second sensing points 430a and 430b.

The control element 200h shown in FIG. 8 is configured to detect twisting interactions or gestures as well as push-pull gestures. The twist control element 200f comprises a pair of push-pull control elements 200b that operate in the same way as described above in relation to FIGS. 5a-5c. The first, second and third sensing points 430a-430c of the connection circuit board 400 are only shown for one of the pair of control elements 200b for convenience. The pair of push-pull control elements 200b are arranged in a spaced apart relationship with their axis or rotation or pivot axis substantially aligned. The force transferring portion 13 of each electrode 10 extends into a handle portion 210h for the user to grip and apply a twisting or push-pull force to. When a user applies a twisting force to the handle portion 210h (either clockwise or anti-clockwise), the sensing electrode 10 of each of the pair of control elements 200b move and/or deform in opposite directions. As such, one of the control elements 200b will move/deform to its first actuated position while the other will move/deform to its second actuated position. It will be appreciated that the twist control element 210h can also be used to detect push-pull gestures where the sensing electrode 10 of each of the pair of control elements 200b moves and/or deforms in the same direction. The twist control element 200h may be suitable for seating and/or lighting controls within a vehicle interior. The twist control element 200h may further comprise one or more touch button and/or slider bar control elements 100b, as shown, e.g. to select a seat and/or light to control.

Each of the aforementioned configurations of the pressure sensing control elements 200 correspond to a use case variation, however, it will be appreciated that the number of electrode portions 12a, 12b and 12c and their arrangements are not limited to the given use cases. For example, in control element 200g, the first sensing point 430 on the connection circuit board 400 can be the ground/reference electrode instead of the second sensing point 430b. Another example is to remove the second sensing point 430b from the connection circuit board 400, and as a result the control element 200g will become a capacitive push button rather than a pressure-sensitive button. That is, the control element 200g would provide a capacitive touch button function but is moveable/deformable to provide a positive tactile feedback to the operator. In a further example of control elements 200a, 200f, 200g and 200h, the first, second and third portions 12a-12c of the sensing electrode 10 are separate pieces of conductive plastics bounded by the plastic over-layer 20, wherein the plastic over-layer 20 is substantially flexible and preferably over-moulded on top of the separate electrodes.

Figure 9:
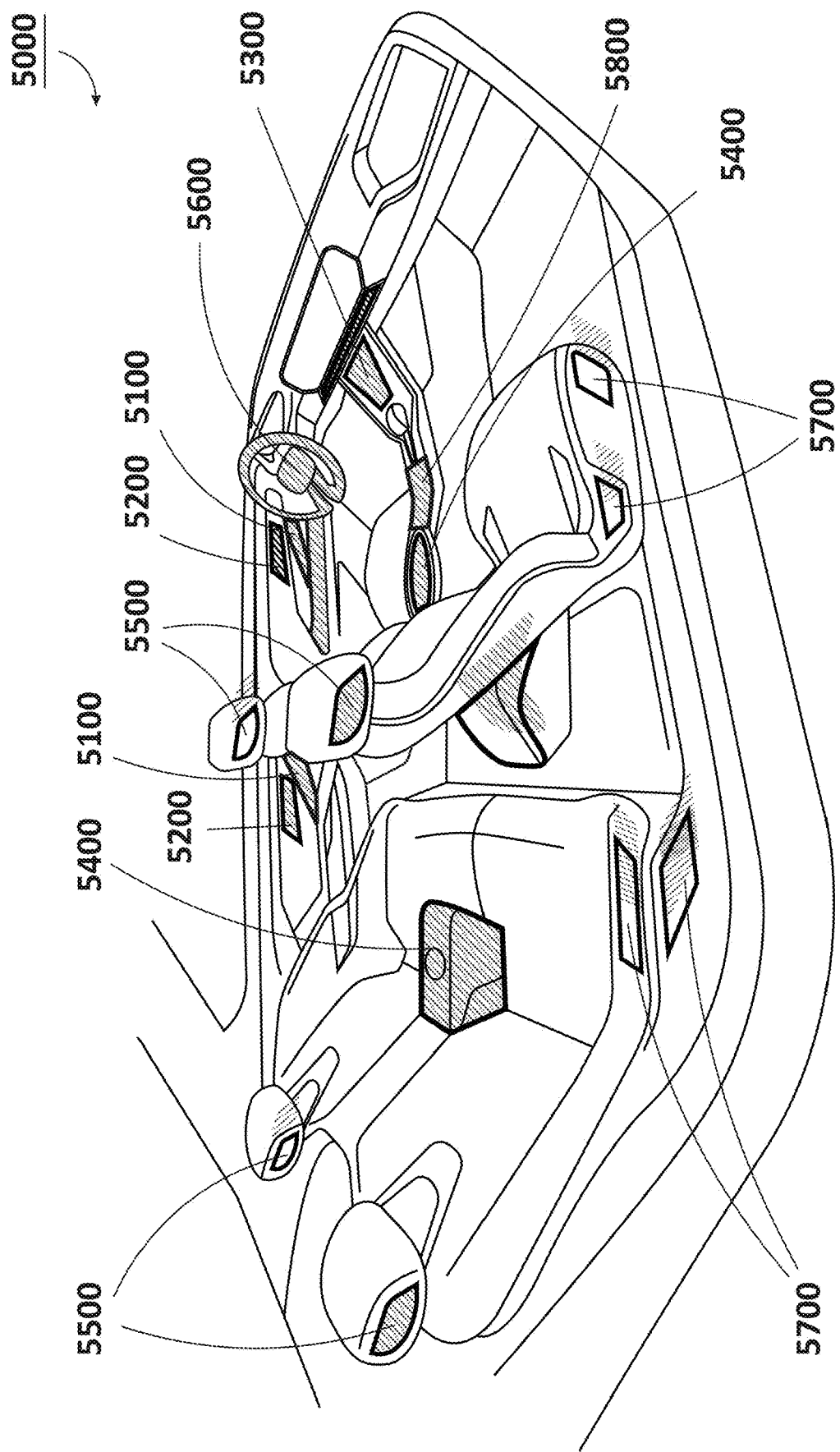
FIG. 9 shows example areas of a vehicle interior in which control systems according to the invention can be integrated.

The example control system 1000 shown in FIGS. 1a, 1b and 2 may be suitable for integrating into the centre console of a vehicle (not shown). However, variations of the control system may be integrated into almost any location in the vehicle interior. FIG. 9 shows example locations in a vehicle interior 5000 in which control systems according to the present invention can be integrated, including but not limited to: a door handle 5100, a door trim panel 5200, a dashboard element 5300, a seat element (e.g. an armrest 5400, headrest 5500, lower seat portion 5700), centre console 5800 and a steering wheel 5600.

Figure 10:
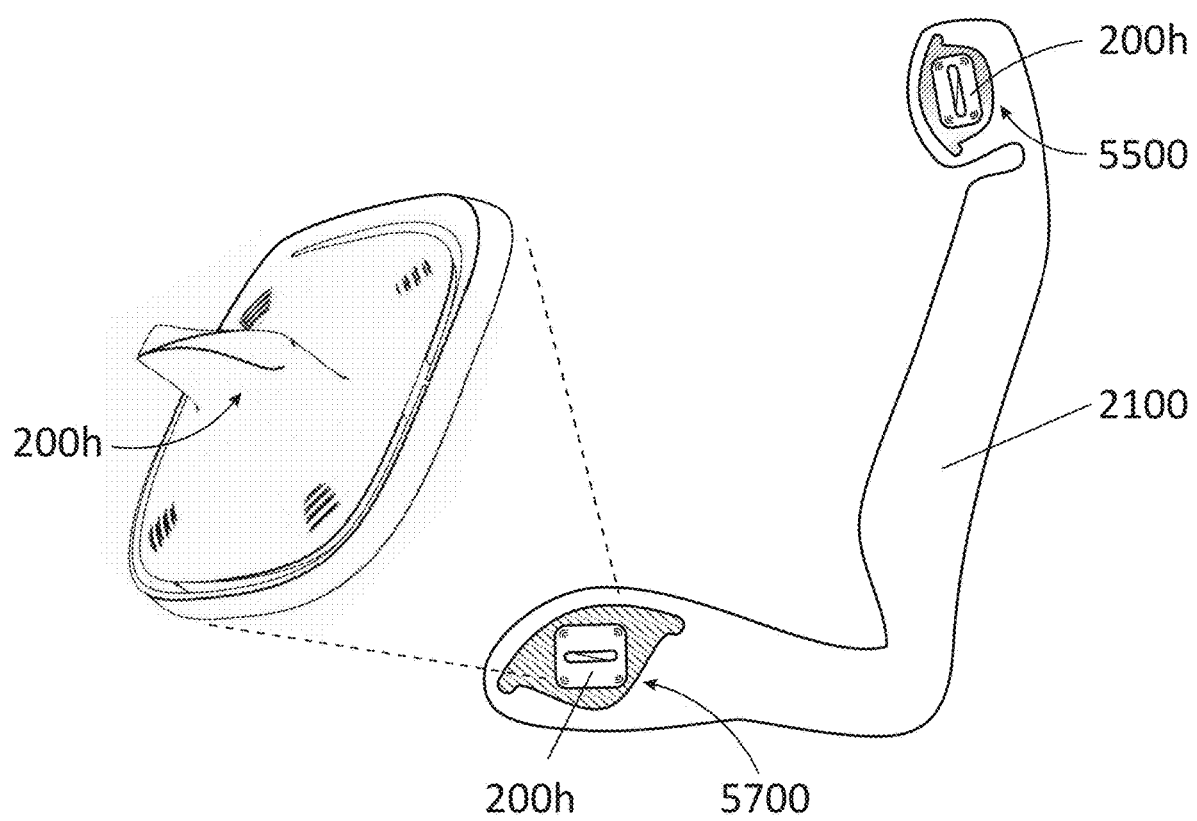
FIG. 10 shows a control system comprising the control element of FIG. 7 integrated into a vehicle seat.
Figure 11A:
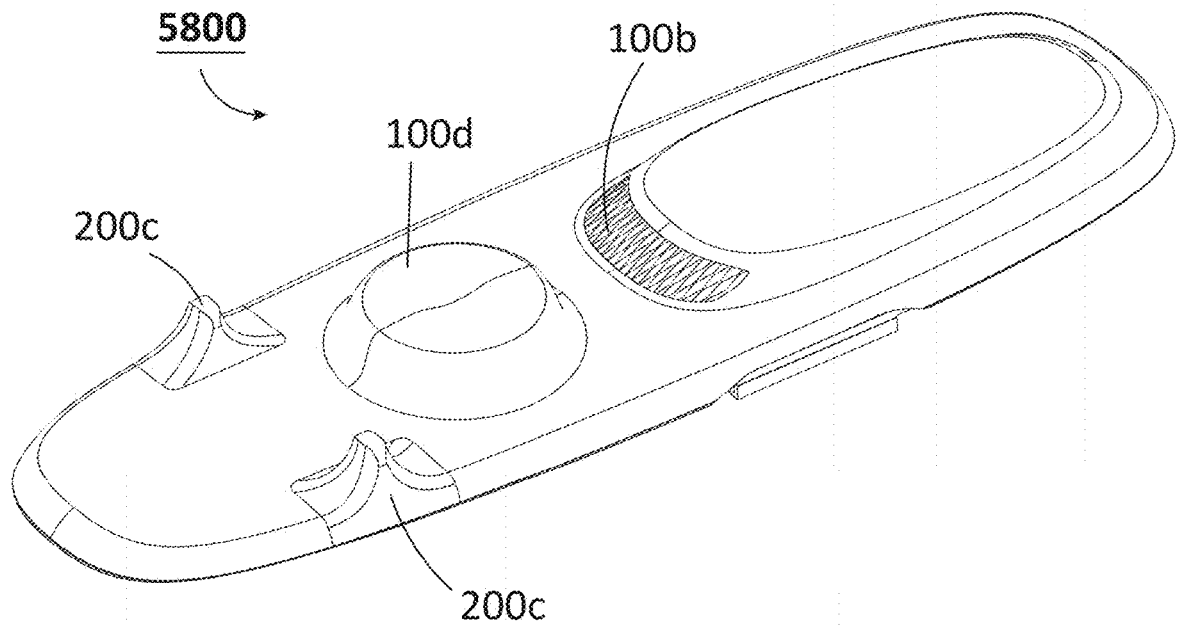
FIG. 11a shows another example control system comprising a plurality of control elements according to embodiments of the invention.
Figure 11B:
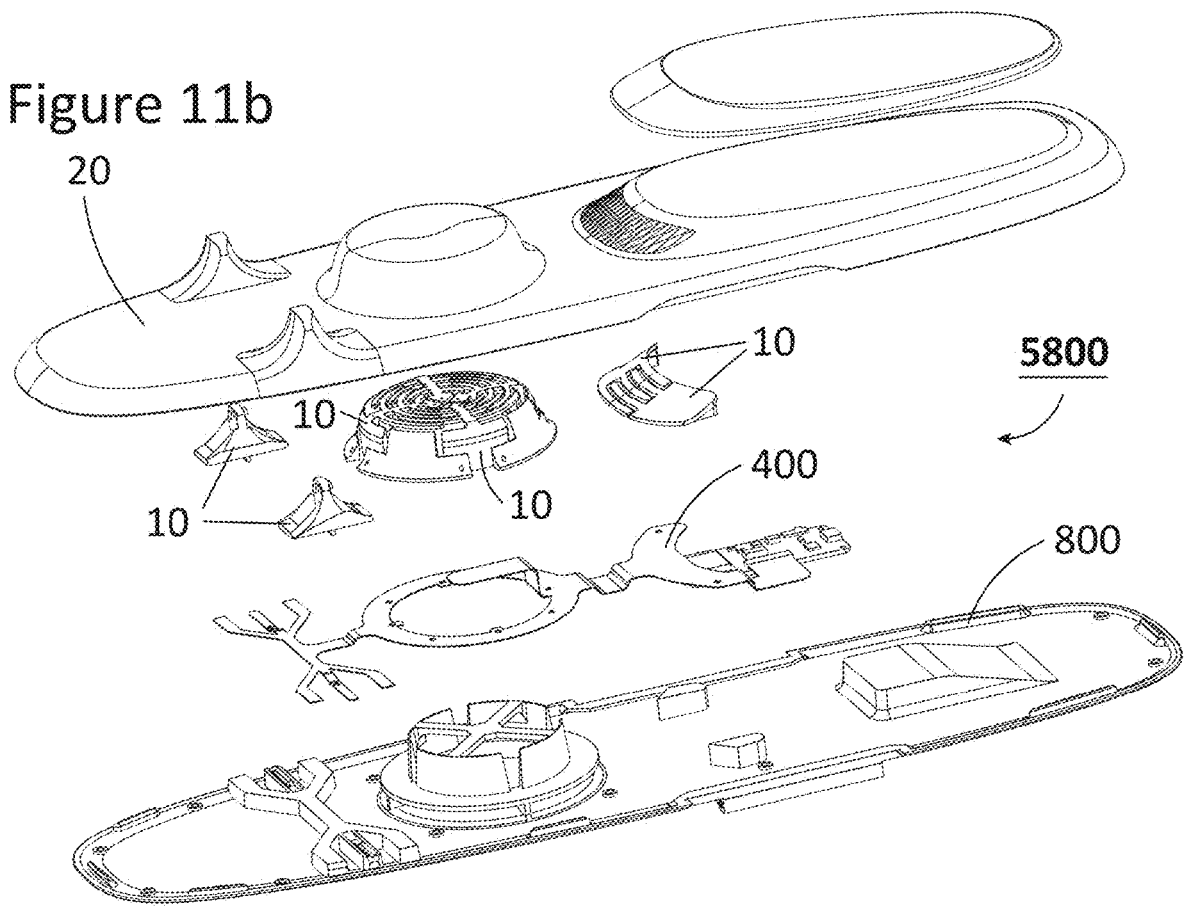
Figure 12:
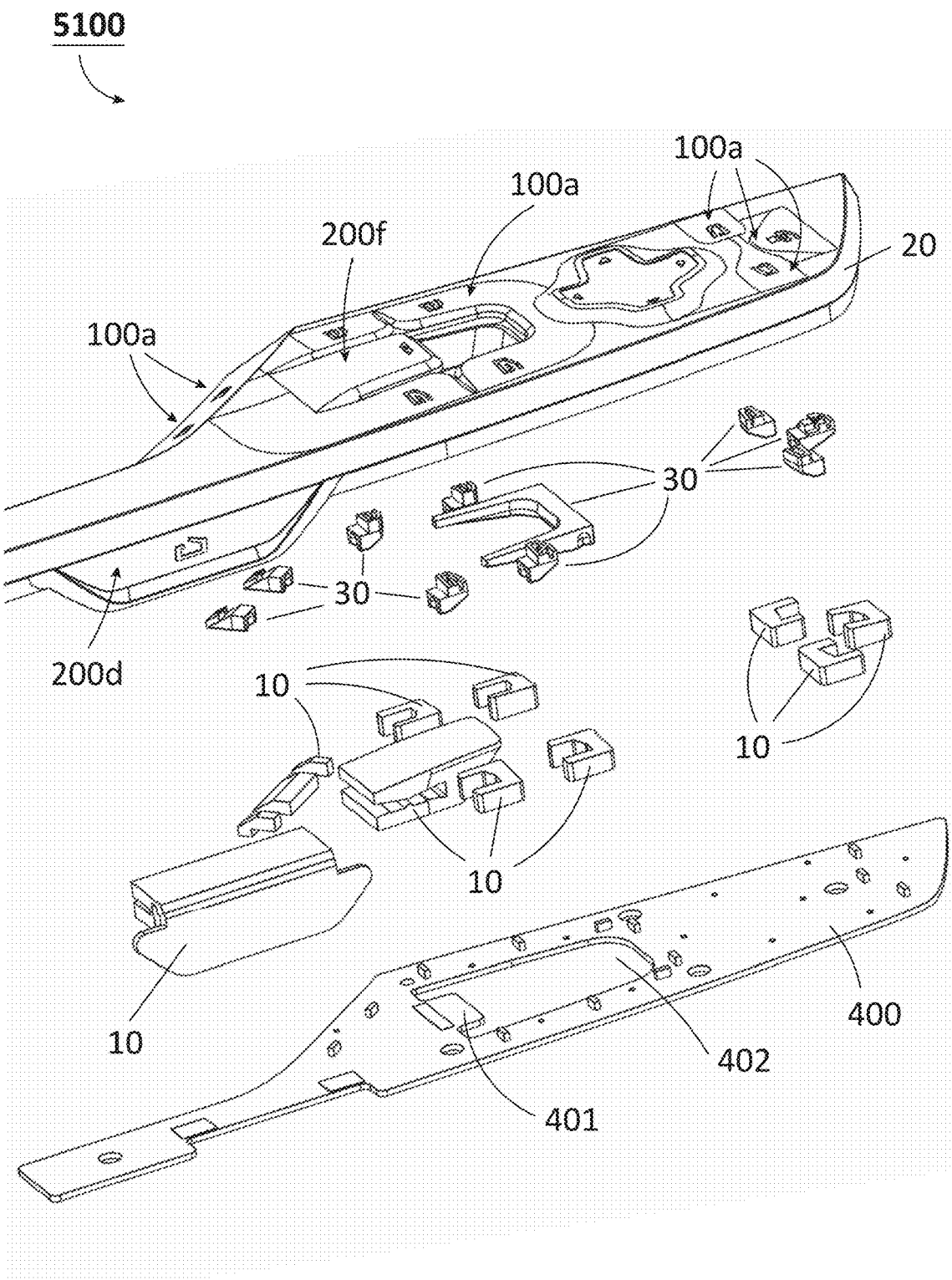
FIG. 12 shows an exploded view of an example control system for a door handle area comprising a plurality of control elements according to embodiments of the invention.

FIG. 10 shows control systems 5500 and 5700 integrated into seat 2100 of a vehicle comprising a twist control element 200h for controlling a seat and headrest position, respectively. FIG. 11a shows a control system 5800 for a centre console or armrest of a vehicle. The system 5800 comprises a pair of push-pull control elements 200c, a trackpad 100d and a slider bar 100b. FIG. 11b shows an exploded view of the control system 5800. The system 5800 comprises a plastic body 800 defining a control zone for supporting the connection circuit board 400 and the control elements 100, 200. The plastic over-layer 20 covers the entire control zone. FIG. 12 shows an exploded view of a control system 5100 for a door handle of a vehicle. The system 5100 comprises a push-pull control element 200f for operating a window, a push button control element 200d for locking and unlocking the vehicle, a plurality of touch button control elements 100a for selecting a window to operate with the push-pull control element 200f, and a plurality of touch button control elements 100a for mirror controls.

Figure 13:
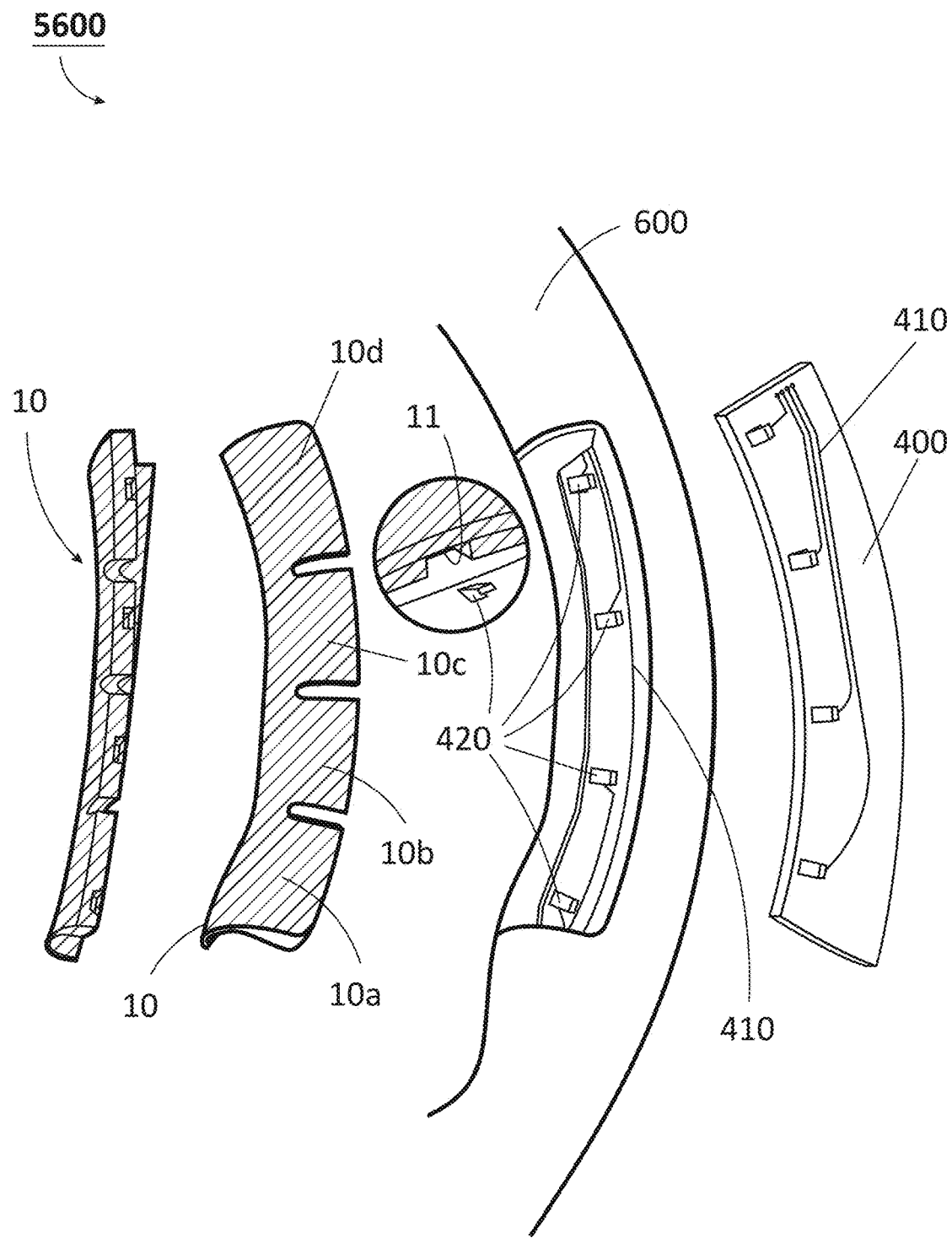
FIG. 13 shows an example control system for a steering wheel comprising a touch sensing control element according to an embodiment of the invention.

FIG. 13 shows a control system 5600 for a steering wheel 600 of a vehicle. The control system 5600 comprises touch sensing control element 100e for detecting finger position, grip/squeeze strength/pressure, hand positioning and/or whether a hand is on or off the steering wheel. In this example, the sensing electrode 10 is configured to wrap around the steering wheel handle 600 in the region where the driver grips or holds the steering wheel 600 and comprises multiple portions 10, 10b, 10c, 10d spatially distributed around the steering wheel handle. Each portion 10a-10d is connected to a separate sensing point on the connection circuit board 400 by a mechanical electrical connector 420 (a spring clip connector in this example) to provide a separate electrical signal in response to touch by the driver, such as touch by different fingers or portions of a finger. The portion of the finger may be or comprise a proximal, intermediate or distal phalange of the finger. The electrode portions 10a-10d are distributed in a pattern corresponding to expected finger positions. In this way, the position or vicinity of touch and/or finger movement relative to the sensing electrode 10 can be determined from the electrical signal provided by each sensing electrode portion 10a-10d.

The above control elements 100, 200 may further comprises one or more visual indicator elements or icons e.g. that highlight the control element 200, 20 and/or the function of the control element 100, 200. The icons may be passive icons, e.g. formed by additional layers of coloured plastics 40 over-moulded onto the plastic over-layer 20, or printed graphics, as shown in FIG. 2. Alternative or additionally, the visual elements may be or comprise light emitting elements, e.g. the icon may light up.

Figure 14:
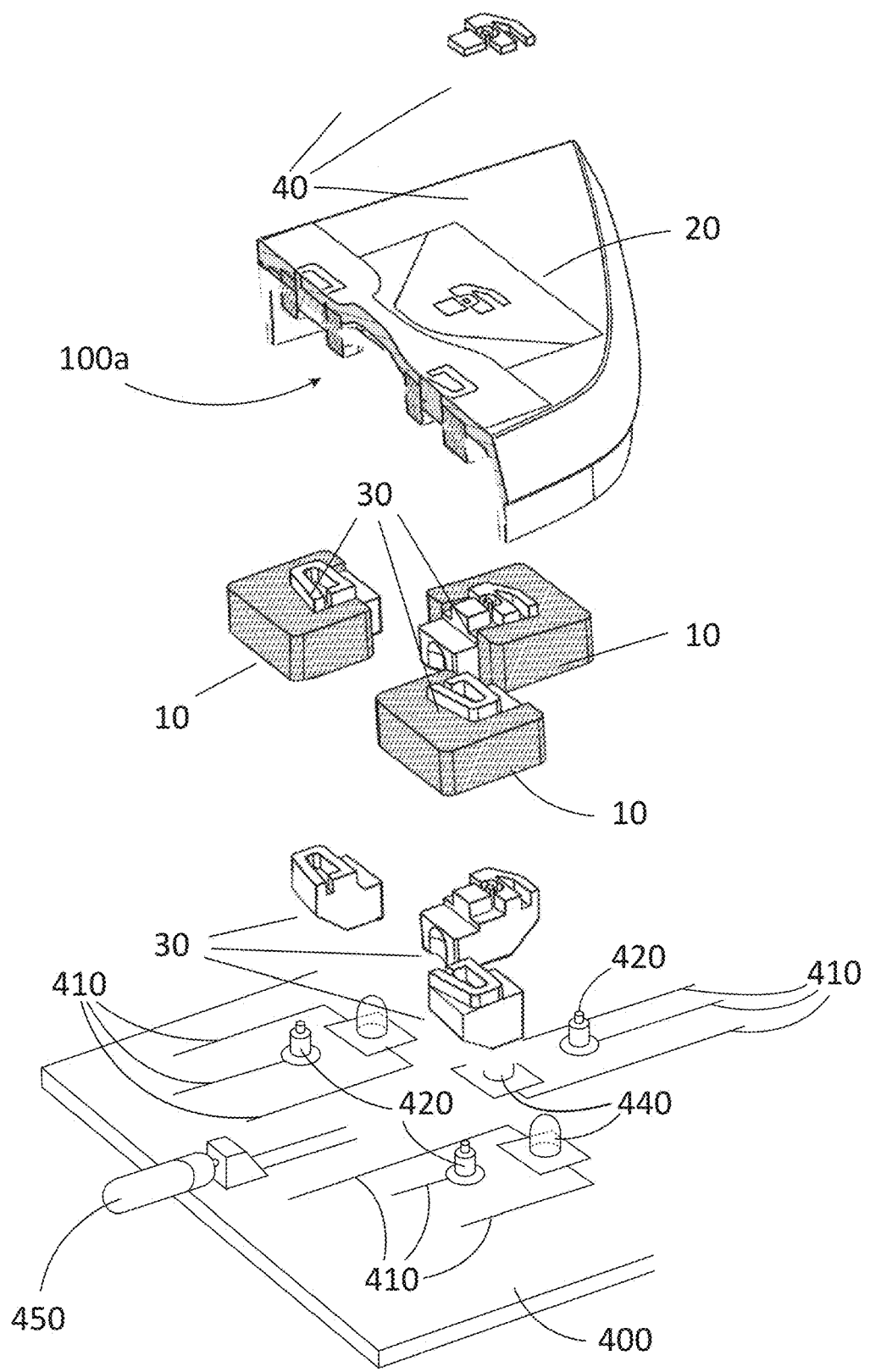
FIG. 14 shows example control elements comprising a light emitting device.
Figure 15:
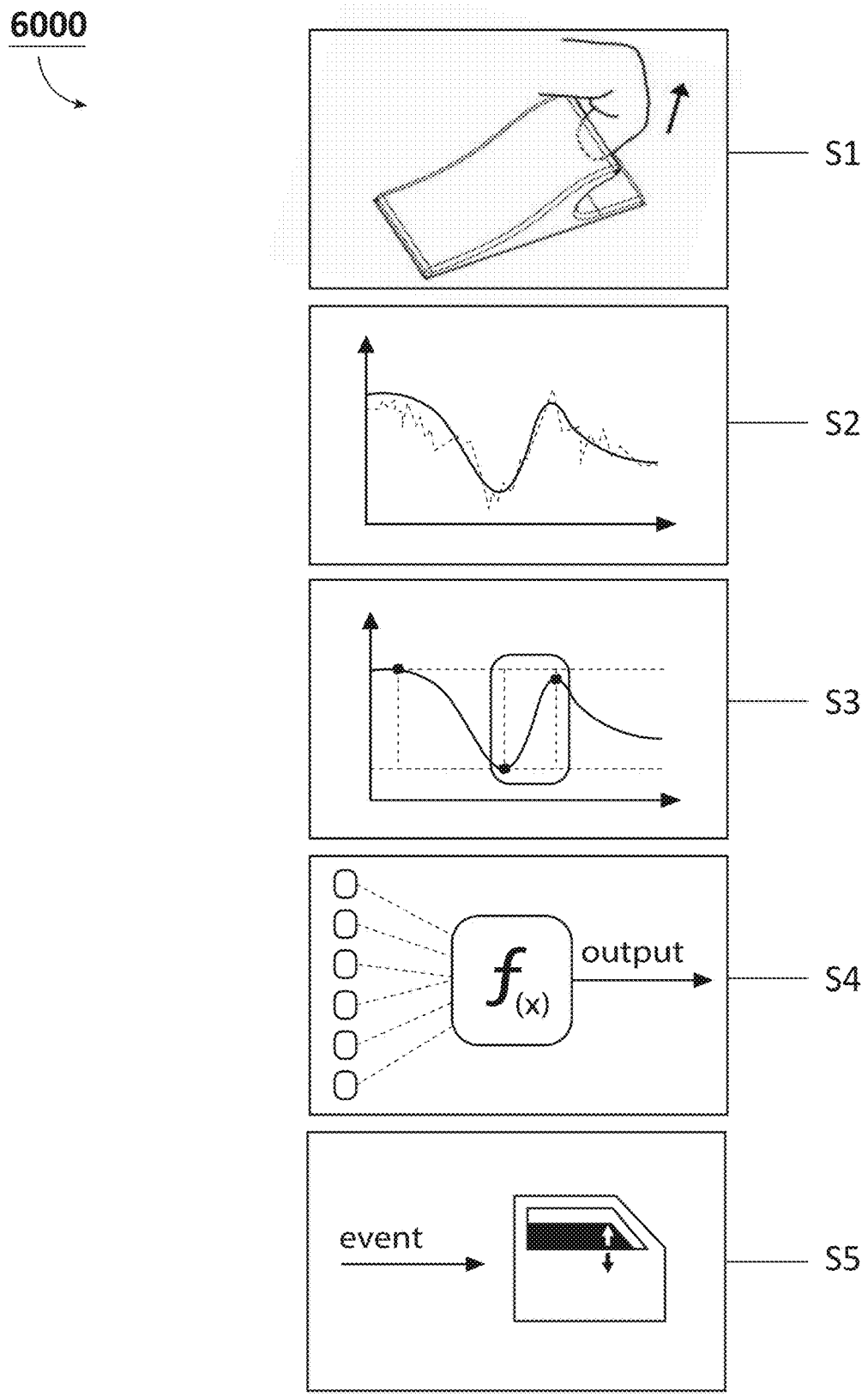
FIG. 15 shows an example method of controlling a vehicle function using a control system of the invention.

FIG. 14 shows an example of touch sensing control elements 100a comprising light emitting elements 30. The connection circuit board 400 comprises one or more light emitting devices 440, such as light emitting diodes (LEDs) and the control element 100a comprises one or more substantially transparent plastic light guide portions 30 that extend through at least a portion of the sensing electrode 100 to guide light emitted from the one or more LEDs 440 through the sensing electrode 10. The or each light guide portion 30 may be configured to fit on or over the LED 440. This may improve the coupling of light into the light guide portion 30, and may also help to position or locate the control element 100b on the connection circuit board during assembly. The or each LED 440 is operated by the measurement module 300 and connected to it via one or more conductive tracks 410. Depending on the configuration of the control system, the sensing electrodes 10 can be configured to at least partially wrap around light guide portions 30 as shown in FIG. 13 or can be configured with an aperture for the light guide portion to fit in as shown on FIG. 2. Each control element 100a may be lit by a separate LED 440 or multiple control elements 110a may be lit by the same LED 440. Variations of the light guide portions 30 are shown in FIG. 11.

The light guide portions 30 are preferably also formed by injection moulding and can be integrated with the sensing electrodes 10 during assembly. The plastic over-layer 20 may then be over-moulded onto the sensing electrode(s) 10 and the light guide portion(s) 30, such that the light emitted through the light emitted from the one or more LEDs 440 can pass through the plastic over-layer 20 and be visible to the user. The or each light guide portion 30 may be configured to diffuse the transmitted light such that the entire light guide portion 30 lights up substantially uniformly.

The control elements 100, 200 may further comprise decorative elements 40 applied on top of the plastic over-layer 20 and/or the light guide portions 30. The decorative elements 40 may be or comprise raised elements or depressions to provide tactile feedback to the operator. The decorative elements 40 may be screen-printed or spray-painted inks/paints on the surface. Alternatively, the decorative elements 40 may be formed by etching away regions from a spray-painted or screen-printed surface of the control element 100, 200.

The measurement module 300 is configured to measure the one or more electrical signals at the one or more sensing points 430. The measurement module may be configured to measure the electrical signals simultaneously or individually. For example, the measurement module 300 may be configured to scan through each sensing point 430 on the connection circuit board 400 sequentially (i.e. one by one) to measure each electrical signal separately. For example, the measurement module 300 may comprise a multiplexer function. The scan frequency may be sufficiently high compared to a typical movement speed of the conductive object 500 or the sensing electrode(s) 10 to minimise any measurement lag, such that a user perceives the measurement/detection to be in real-time. For example, the scan rate may be in the range 100-200 Hz. The scan rate may be slower or faster depending on the application.

The measurement module 300 is further configured to detect a user interaction with the control element 100, 200 based on the one or more electrical signals. The measurement module 300 is configured to detect one or more of: a contact or touch from a user/operator, a contact/touch position, a speed and/or direction and/or amount of movement of said conductive object 500 on/across the surface of the plastic over-layer 20 relative to the one or more sensing points 430 based on the one or more electrical signals provided by the touch sensing control element 100. In addition, the measurement module 300 may be configured to detect one or more of: movement/deformation, direction of movement/deformation, and/or amount of movement/deformation of the sensing electrode 10 relative to the or each sensing point 430 on the connection circuit board 400 based on the one or more electrical signals provided by the touch sensing control element 100.

The measurement module 300 comprises a capacitive sensing chip (not shown) with one or more sensing or input channels for measuring changes in capacitance, such as a capacitive sensing micro-processor or micro-controller. The capacitive sensing chip can measure changes in self-capacitance at a sensing point 430, for the touch sensing control elements 100 and/or changes in capacitance between a pair of sensing points 430 for the mechanical pressure sensing control elements 200. In the latter case, as the sensing electrodes 10 of the mechanical pressure sensing control elements 200 are connected to a sensing point 430b on the connection circuit board 400 which serves as a ground or reference point, the capacitance is effectively measured between the sensing electrode 10 and the sensing point 430a, 430c. The capacitance measurement may optionally be a frequency-based measurement.

The measurement module 300 further comprises a processing unit or chip (not shown) in data communication with the capacitive sensing chip to receive measurement data therefrom. The processing unit/chip comprises one or more processors and one or more memories storing a software program, that when executed or run on the one or more processors cause the processing unit/chip to process and/or analyse the measurement data to determine a user interaction or gesture information. The user interaction or gesture information may include one or more of: a contact or touch from a user/operator, a contact/touch position, a speed and/or direction and/or amount of movement of said conductive object 500 on/across the surface of the plastic over-layer 20 for a touch sensing control element 100, and/or a movement/deformation, direction of movement/deformation, and/or amount of movement/deformation of a sensing electrode 10 relative to a sensing point 430 on the connection circuit board 400 for a mechanical pressure sensing control element 200. Processing and/or analysing the measurement data may comprise filtering, smoothing, differentiating, peak finding and/or comparing data to one or more predefined thresholds. The processing unit/chip may then be configured to generate one or more control signals that, when provided to the vehicle ECU, will trigger the ECU to control one or more vehicle functions.

An example method 6000 of controlling one or more vehicle functions using the control system 1000 of the present invention is shown in FIG. 14. At step S1, a user interacts with a control element 100, 200 via any of the gestures described above. This may involve touching and/or applied a force or pressure to the control element 100, 200 that causes a change in the one or more electrical signals provided. In step S2, the one or more electrical signals are measured by the measurement module 300, preferably over a period of time. The measurement data waveform is acquired by the capacitive sensing chip and/or processing unit/chip as a digital signal. The digital signal is processed through the processing unit/chip through one or more filters, such as low-pass filters, to reduce noise and smooth the signal. This may refine the signal characteristics and simply its use in other algorithms. In step S3, the signal characteristics are analysed using further algorithms to extract one or more signal features for classifying the information. This may involve extracting one or more of: signal amplitudes, turning points (peaks/troughs), intervals between turning points, and/or derivatives (first and/or second order). In step S4, the extracted signal features are clustered and passed to a classification model to detect different signal patterns and classify the user interaction(s) as events, such as opening/closing a window or changing a volume level. Step S4 may further comprise generating one or more control or event signals that are associated with or identify the user interaction(s)/event(s) for sending to the ECU. In step S5, the control/event signals are sent to the ECU to trigger one or more vehicle functions.

Any of the above described control systems 1000 may further comprise a haptic feedback module 450 in communication with the measurement module 300. For example, the haptic feedback module 450 may comprise a vibration motor 450 mounted on or to the connection circuit 400 board, and the measurement module 300 may be configured to control the vibration motor 450. The vibration motor 450 can be either eccentric rotating mass (ERM), or a linear resonant actuator (LRA) as in known in the art. Varying vibration feedback patterns can be configured and provided in response to the actuation/movement of a control element 100, 200 and/or detection of various stages of a user interaction.

From reading the present disclosure, other variations and modifications will be apparent to the skilled person. Such variations and modifications may involve equivalent and other features which are already known in the art, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems a s does the present invention.

Features which are described in the context of separate embodiments may also be provided in combination in a single embodiment. Conversely, various features which are, for brevity, described in the context of a single embodiment, may also be provided separately or in any suitable subcombination.

For the sake of completeness it is also stated that the term "comprising" does not exclude other elements or steps, the term "a" or "an" does not exclude a plurality, and any reference signs in the claims shall not be construed as limiting the scope of the claims.

The invention claimed is:

1. A vehicle control system for a vehicle interior, comprising:
   a control element for a user to interact with to control one or more user controllable vehicle functions, the control element comprising:
   a conductive plastic sensing electrode configured to provide one or more electrical signals in response to a user interaction with the control element;
   a non-conductive plastic cover material provided on or over the conductive plastic sensing electrode; and
   a connection circuit board comprising a plurality of sensing points for measuring the one or more electrical signals provided by the control element;
   wherein the conductive plastic sensing electrode is configured to electrically connect to at least one of the sensing points of the connection circuit board by means of mechanical and/or frictional engagement to measure the one or more electrical signals,
   wherein the conductive plastic sensing electrode is configured to provide the one or more electrical signals in response to a change in capacitance caused by contact and/or movement of a conductive object on/across the non-conductive plastic cover material on/over the sensing electrode, and/or in response to a change in capacitance caused by a pressure or force applied on/to the non-conductive plastic cover material on or over the sensing electrode, and
   wherein the control system is connectable to an electronic control unit (ECU) of the vehicle for controlling one or more user controllable vehicle functions in response to a user interaction with the control element.

2. The control system of claim 1, wherein the conductive sensing electrode and the non-conductive cover material are formed by an injection moulding process; and, optionally or preferably, wherein the non-conductive cover material is substantially flexible/deformable and resilient.

3. The control system of claim 1, wherein the conductive sensing electrode comprises a first portion configured to face and mechanically contact and/or engage a first sensing point on the connection circuit board to provide an electrical connection therebetween.

4. The control system of claim 3, wherein the mechanical engagement between the first portion and the first sensing point substantially prevents relative movement between the first portion and the first sensing point.

5. The control system of claim 3, wherein the first sensing point comprises an electrical connector having a substantially rigid mating portion, configured to mechanically contact, deform and/or penetrate the first portion of the conductive sensing electrode to provide an electrical connection therebetween.

6. The control system of claim 5, wherein the electrical connector is further configured to frictionally engage with the first portion of the conductive sensing electrode to secure the conductive sensing electrode to the connection circuit board; and/or wherein the connection circuit board comprises a securing element configured to frictionally engage with a corresponding securing portion of the conductive sensing electrode to secure the conductive sensing electrode to the connection circuit board; and, optionally or preferably, wherein the frictional engagement maintains the mechanical contact between the first portion and the first sensing point.

7. The control system of claim 6, wherein the electrical connector and/or securing element is or comprises a projection that projects from the connection circuit board, and wherein the first portion and/or securing portion of the conductive sensing electrode comprises a recess configured to frictionally engage with the projection; or
wherein the electrical connector and/or securing element is or comprises a recess, opening or through-hole in the connection circuit board, and wherein the first portion and/or the securing portion of the conductive sensing electrode is or comprises a projection configured to frictionally engage with the recess, opening or through-hole.

8. The control system of claim 1, wherein the control element comprises a plurality of said conductive plastic sensing electrodes and the non-conductive plastic cover material is provided on or over each of the plurality of sensing electrodes, each of the plurality of sensing electrodes being configured to provide a change in the one or more electrical signals in response to movement of a conductive object on/across the non-conductive material; and, optionally or preferably,
wherein two or more adjacent one of the plurality of sensing electrodes are configured to interdigitate with each other in one or more directions, so as to provide a substantially smooth change in the one or more electrical signals in response to movement of said conductive object on/across the non-conductive plastic material.

9. The control system of claim 3, wherein the mechanical engagement between the first portion and the first sensing point permits movement of the first portion relative to the first sensing point whilst maintaining constant electrical contact with the first sensing point;
and optionally or preferably, wherein the first portion is configured to permit the conductive sensing electrode to pivot/rotate about/around the first portion whilst maintaining constant electrical contact with the first sensing point.

10. The control system of claim 3, wherein the conductive sensing electrode comprises a second portion configured to face a second sensing point on the connection circuit board, and be movable and/or deformable in response to a pressure/force applied to the conductive sensing electrode from a rest position to first actuated position so as to change a distance between the second portion and the second sensing point; and, optionally or preferably, wherein the conductive sensing electrode is configured to pivot/rotate about/around the first portion from the rest position to the first actuated position; and, optionally or preferably, wherein the second portion is configured to move, or at least partially deform/bend, with respect to the first portion in response to a pressure or force applied to the second portion.

11. The control system of claim 3, wherein the conductive sensing electrode comprises a slot for receiving a portion of the connection circuit board, and wherein the conductive sensing electrode is configured to grip and/or frictionally engage the connection circuit board between opposing walls of the slot; and optionally or preferably, wherein the gripping action and/or frictional engagement maintains the mechanical contact between the first portion and the first sensing point.

12. The control system of claim 10, wherein the second sensing point is on the same side or the opposite side of the connection circuit board as/to the first sensing point.

13. The control system of claim 10, wherein the conductive sensing electrode comprises a third portion configured to face a third electrode on the connection circuit board, and be movable and/or deformable in response to a pressure/force applied to the conductive sensing electrode from a rest position to a second actuated position so as to change a distance between the third portion and the third sensing point.

14. The control system of claim 13, wherein the conductive sensing electrode is configured to pivot/rotate about/around the first portion from the rest position to the second actuated position; and, optionally or preferably, wherein the third portion is configured to move, or at least partially deform/bend with respect to the first portion in response to a pressure/force applied to the third portion; and/or wherein the third sensing point is located on the same side or the opposite side of the connection circuit board as/to the second sensing point; and/or wherein the first, second and third portions of the conductive sensing electrode are part of a unitary piece of conductive plastic, or wherein the first, second and third portions of the conductive sensing electrode are separate pieces of conductive plastic.

15. The control system claim 1, further comprising a measurement module connected to the one or more sensing points, the measurement module configured to:
measure the one or more electrical signals;
detect a user interaction with the control element based on the one or more electrical signals; and
provide one or more control signals associated with the user interaction for the ECU; and,
optionally or preferably, wherein the measurement module is mounted on or to the connection circuit board and connected to the one or more sensing points via one or more conductive tracks; or
wherein the measurement module is separate from the connection circuit board and electrically connected to one or more conductive tracks on the connection circuit board via a flexible interconnect; and, optionally or preferably, wherein the flexible interconnect is or comprises one or more printed circuit boards, flexible printed circuit boards, wires and/or cables.

16. The control system of claim 1, wherein the connection circuit board further comprises a light emitting device and the control element further comprises one or more substantially transparent plastic light guide portions that extend through the conductive sensing electrode to guide light emitted from the light emitting device through the conductive sensing electrode; and, optionally or preferably, wherein the non-conductive plastic material is over-moulded onto the conductive sensing electrode and the one or more substantially transparent plastic light guide portions.

17. The control system of claim 15, further comprising a haptic feedback module in communication with the measurement module, and wherein the measurement module is configured to control the haptic feedback module so as to activate in response to detection of a user interaction; and, optionally or preferably, wherein the haptic feedback module is or comprises a vibration motor mounted on or to the connection circuit board.

18. The control system of claim 1, wherein the control element is shaped and configured to provide a touch button function, trackpad function, slider function, a static rotary knob function, push button function and/or a push or pull trigger/switch function.

19. The control system of claim 15, further comprising a plurality of said control elements, each control element mounted to the same connection circuit board; and, optionally or preferably, wherein the one or more sensing points of each control element is connected to the measurement module; and, optionally or preferably, wherein the non-conductive plastic cover material of each control element is a unitary piece of material provided over/around all of the control elements.

20. The control system of claim 1, further comprising a non-conductive plastic body for supporting the one or more of said control element in a control zone, wherein the non-conductive body is or comprises at least a part of one of the following parts of the interior of the vehicle: a door handle; a door trim panel; a dashboard element; a centre console; an armrest; a headrest, a steering wheel; or a seat element.

21. A vehicle, comprising:
an electronic control module (ECU) for controlling one or more user controllable vehicle functions;
one or more user controllable systems comprising one or more of: electric windows, motorised seats, central locking, an audio system, an entertainment system, a navigation system, a climate control system, a cruise control system, and/or a lighting system; and
a control system according to claim 1 in communication with the ECU so as to control the one or more user controllable vehicle functions in response to a user interaction with the control element.

* * * * *